US012475816B2

(12) United States Patent
Chen

(10) Patent No.: US 12,475,816 B2
(45) Date of Patent: Nov. 18, 2025

(54) ELECTRONIC DEVICE

(71) Applicant: Huawei Technologies Co., Ltd., Shenzhen (CN)

(72) Inventor: Bo Chen, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 700 days.

(21) Appl. No.: 17/793,988

(22) PCT Filed: Jan. 12, 2021

(86) PCT No.: PCT/CN2021/071287
§ 371 (c)(1),
(2) Date: Jul. 20, 2022

(87) PCT Pub. No.: WO2021/147709
PCT Pub. Date: Jul. 29, 2021

(65) Prior Publication Data
US 2023/0096985 A1 Mar. 30, 2023

(30) Foreign Application Priority Data

Jan. 20, 2020 (CN) .......................... 202010066004.5
Mar. 18, 2020 (CN) .......................... 202010191174.6

(51) Int. Cl.
*H10K 77/10* (2023.01)
*B32B 3/26* (2006.01)
(Continued)

(52) U.S. Cl.
CPC .............. *G09F 9/301* (2013.01); *B32B 3/266* (2013.01); *B32B 5/18* (2013.01); *B32B 7/12* (2013.01); *B32B 15/043* (2013.01); *B32B 27/065* (2013.01); *B32B 27/36* (2013.01); *H10K 50/8426* (2023.02); *H10K 77/111* (2023.02); *B32B 2266/12* (2016.11); *B32B 2457/20* (2013.01); *H10K 2102/311* (2023.02)

(58) Field of Classification Search
CPC ....... G09F 9/301; G09F 9/33; H10K 50/8426; H10K 77/111; H10K 2102/311; B32B 2457/20; H04M 1/0216; H04M 1/0266
See application file for complete search history.

(56) References Cited

U.S. PATENT DOCUMENTS 10,541,279 B2 * 1/2020 An .......................... G06F 3/0446
11,075,251 B2 * 7/2021 Yang ...................... G06F 3/0412
(Continued)

FOREIGN PATENT DOCUMENTS

CN 106373490 A 2/2017
CN 107230429 A 10/2017
(Continued)

*Primary Examiner* — Jarrett J Stark
(74) *Attorney, Agent, or Firm* — Conley Rose, P.C.

(57) ABSTRACT

An electronic device includes a flexible display, a housing assembly, and an adhesive layer assembly fastened between the flexible display and the housing assembly. The adhesive layer assembly includes a strong adhesive layer and a weak adhesive layer, and a stiffness of the strong adhesive layer is higher than a stiffness of the weak adhesive layer. The strong adhesive layer and the weak adhesive layer are arranged to make the flexible display deform with the electronic device.

20 Claims, 11 Drawing Sheets

(51) Int. Cl.
  *B32B 5/18*     (2006.01)
  *B32B 7/12*     (2006.01)
  *B32B 15/04*    (2006.01)
  *B32B 27/06*    (2006.01)
  *B32B 27/36*    (2006.01)
  *G09F 9/30*     (2006.01)
  *H10K 50/842*   (2023.01)
  *H10K 102/00*   (2023.01)

(56) References Cited

U.S. PATENT DOCUMENTS

| | | | |
|---|---|---|---|
| 2005/0093437 A1* | 5/2005 | Ouyang | H10K 50/865 |
| | | | 313/511 |
| 2010/0293782 A1* | 11/2010 | Yamazaki | H10K 50/84 |
| | | | 29/825 |
| 2014/0139481 A1* | 5/2014 | Han | G06F 3/0448 |
| | | | 345/174 |
| 2014/0254111 A1* | 9/2014 | Yamazaki | H10K 59/131 |
| | | | 361/749 |
| 2015/0004345 A1* | 1/2015 | Chaung | C09J 5/06 |
| | | | 428/189 |
| 2015/0049281 A1* | 2/2015 | Lee | H10K 59/873 |
| | | | 349/110 |
| 2015/0201487 A1* | 7/2015 | Kee | G02F 1/133305 |
| | | | 361/749 |
| 2015/0286253 A1* | 10/2015 | Jung | G06F 3/04164 |
| | | | 361/679.3 |
| 2015/0380673 A1* | 12/2015 | Ito | H10K 77/111 |
| | | | 257/99 |
| 2016/0118616 A1* | 4/2016 | Hiroki | H10K 59/12 |
| | | | 257/40 |
| 2016/0188098 A1* | 6/2016 | Her | G06F 1/1652 |
| | | | 345/173 |
| 2016/0306460 A1* | 10/2016 | Lee | H10K 50/86 |
| 2016/0338219 A1* | 11/2016 | Seo | G02F 1/133308 |
| 2016/0343992 A1* | 11/2016 | Kim | H10K 59/873 |
| 2016/0378224 A1* | 12/2016 | Kwon | H10K 59/8731 |
| | | | 345/174 |
| 2017/0025634 A1 | 1/2017 | Jeong | |
| 2017/0148859 A1* | 5/2017 | Nishinohara | H10K 59/1213 |
| 2017/0194599 A1* | 7/2017 | Furuie | H10K 50/81 |
| 2017/0196101 A1* | 7/2017 | Ki | G06F 1/1637 |
| 2017/0229666 A1* | 8/2017 | Tsuruoka | H10K 77/111 |
| 2017/0278900 A1* | 9/2017 | Yang | G06F 1/1652 |
| 2017/0338286 A1* | 11/2017 | Oh | H10K 50/86 |
| 2017/0373121 A1* | 12/2017 | Leng | H10K 59/12 |
| 2018/0178483 A1 | 6/2018 | Chu et al. | |
| 2019/0062601 A1* | 2/2019 | Zhang | B32B 27/36 |
| 2019/0064960 A1* | 2/2019 | Na | H10K 59/40 |
| 2019/0094610 A1* | 3/2019 | Yukawa | G02F 1/133528 |
| 2019/0121475 A1* | 4/2019 | Park | G02F 1/1335 |
| 2019/0163003 A1* | 5/2019 | Kim | G06F 3/041 |
| 2019/0259310 A1* | 8/2019 | Ha | H10K 77/111 |
| 2019/0357366 A1 | 11/2019 | Choi et al. | |
| 2019/0392737 A1 | 12/2019 | Du et al. | |
| 2021/0157431 A1 | 5/2021 | Gu et al. | |
| 2022/0317355 A1* | 10/2022 | Luo | G06F 1/1637 |
| 2023/0096985 A1* | 3/2023 | Chen | B32B 27/36 |
| | | | 257/40 |

FOREIGN PATENT DOCUMENTS

| | | |
|---|---|---|
| CN | 110061039 A | 7/2019 |
| CN | 110189638 A | 8/2019 |
| CN | 209625665 U | 11/2019 |
| CN | 209785445 U | 12/2019 |
| CN | 110890025 A | 3/2020 |
| IN | 106910823 A | 6/2017 |
| JP | 2019060906 A | 4/2019 |

\* cited by examiner

ELECTRONIC DEVICE

CROSS-REFERENCE TO RELATED APPLICATIONS

This is a U.S. National Stage of International Patent Application No. PCT/CN2021/071287 filed on Jan. 12, 2021, which claims priority to Chinese Patent Application No. 202010066004.5 filed on Jan. 20, 2020 and Chinese Patent Application No. 202010191174.6 filed on Mar. 18, 2020. All of the aforementioned applications are hereby incorporated by reference in their entireties.

TECHNICAL FIELD

This application relates to the field of communication technologies, and in particular, to an electronic device.

BACKGROUND

In recent years, a flexible display is widely applied to various foldable or rollable electronic devices because of characteristics such as lightness, thinness, and non-fragileness. When the foldable or rollable electronic device is unfolded, the flexible display is unfolded accordingly and has a relatively large display area, so that a user can view a large screen. When the foldable or rollable electronic device is folded or rolled, the flexible display is folded or rolled accordingly, so that the electronic device has a relatively small overall size and is easy to store and carry. However, in a process in which the flexible display repeatedly deforms with the electronic device, film layer separation or an adhesive failure is prone to occur, and reliability is relatively low.

SUMMARY

This application provides an electronic device. Reliability of a flexible display of the electronic device is relatively high.

According to a first aspect, this application provides an electronic device. The electronic device includes a housing assembly, a flexible display, and an adhesive layer assembly. The adhesive layer assembly is bonded between the housing assembly and the flexible display. The housing assembly includes a first housing, a rotating shaft, and a second housing that are connected in sequence. The rotating shaft can deform, so that the first housing and the second housing are unfolded or folded relative to each other. The flexible display includes a first non-bending part, a bending part, and a second non-bending part that are sequentially arranged, the first non-bending part faces the first housing, the bending part faces the rotating shaft, the second non-bending part faces the second housing, and when the first housing and the second housing are folded relative to each other to a closed state, the flexible display is located inside the housing assembly.

The adhesive layer assembly includes two strong adhesive layers and two weak adhesive layers. One strong adhesive layer and one weak adhesive layer are bonded between the first non-bending part and the first housing, and the other strong adhesive layer and the other weak adhesive layer are bonded between the second non-bending part and the second housing. The strong adhesive layer is close to the rotating shaft relative to the adjacent weak adhesive layer, and a stiffness of the strong adhesive layer is higher than a stiffness of the weak adhesive layer.

In a process in which the first housing and the second housing are folded relative to each other to drive the flexible display to be folded, the flexible display moves to be dislocated relative to the housing assembly due to stress generated by deformation of the bent flexible display. The flexible display may be close to or away from the rotating shaft relative to the housing assembly. In this case, the first non-bending part is bonded to the first housing by using the strong adhesive layer and the weak adhesive layer, and the strong adhesive layer is disposed close to the rotating shaft. The second non-bending part is bonded to the second housing by using the strong adhesive layer and the weak adhesive layer, and the strong adhesive layer is disposed close to the rotating shaft. In addition, the stiffness of the strong adhesive layer is higher than the stiffness of the weak adhesive layer. Therefore, when the flexible display is folded, a dislocation of the bending part of the flexible display relative to the housing assembly is relatively small, thereby reducing a risk of arching, film layer separation, or an adhesive failure of the flexible display in a process of unfolding the electronic device because the flexible display cannot be fully restored, and improving reliability of the flexible display. In addition, the first non-bending part can follow the bending part to be dislocated relative to the first housing, the second non-bending part can also follow the bending part to be dislocated relative to the second housing, and stress between the flexible display and the housing assembly is reduced, thereby reducing a risk of arching, film layer separation, or an adhesive failure of the flexible display because a force locally applied to the flexible display is excessively large, and improving the reliability of the flexible display. Therefore, the electronic device is provided with the adhesive layer assembly, to improve the reliability of the flexible display, so that a service life of the electronic device is relatively long, and user experience is better.

In a possible implementation, a modulus of the strong adhesive layer is greater than a modulus of the weak adhesive layer. In this implementation, the strong adhesive layer is made of a material with a relatively large modulus, and the weak adhesive layer is made of a material with a relatively small modulus, so that the stiffness of the strong adhesive layer is higher than the stiffness of the weak adhesive layer, to meet a bonding requirement of the flexible display and the housing assembly.

In a possible implementation, the strong adhesive layer is made of a double-sided adhesive material whose carrier is polyethylene terephthalate, or is made of a hot-melt adhesive material.

In a possible implementation, the weak adhesive layer is made of a double-sided adhesive material whose carrier is foam, or is made of a silica gel material.

In a possible implementation, the weak adhesive layer is made of a double-sided adhesive material without a carrier and with a relatively small modulus.

In a possible implementation, the weak adhesive layer is made of an acrylic-based adhesive material or a rubber-based adhesive material with a relatively small modulus.

In a possible implementation, the strong adhesive layer is in a continuous long strip shape. In this case, an area of the strong adhesive layer is relatively large, which helps implement a relatively high stiffness, to meet a bonding requirement.

In a possible implementation, the weak adhesive layer includes one or more hollow regions, to form a patterned structure. In this case, the stiffness of the weak adhesive layer is relatively low, and is lower than the stiffness of the strong adhesive layer, to meet a bonding requirement.

In a possible implementation, the weak adhesive layer is of a frame structure. The weak adhesive layer includes a hollow region located in the middle. A shape of a frame of the weak adhesive layer changes with shapes of the first non-bending part and the second non-bending part of the flexible display.

In a possible implementation, the weak adhesive layer is of a grid structure. The weak adhesive layer includes a plurality of hollow regions disposed at intervals. The plurality of hollow regions are arranged in an array. The plurality of hollow regions may alternatively be randomly arranged or arranged according to another arrangement rule. A shape of the hollow region may be a rectangle, or may be a circle, an ellipse, a triangle, a rhombus, or another regular or irregular pattern.

In a possible implementation, the weak adhesive layer includes a plurality of long adhesive strips distributed at intervals. A hollow region is formed between two adjacent long adhesive strips. A long side of the long adhesive strip may be a straight line or a wavy line.

In a possible implementation, the weak adhesive layer includes a plurality of adhesive blocks distributed at intervals. A hollow region is formed between two adjacent adhesive blocks. In this implementation, there is one hollow region in the weak adhesive layer, and the hollow region is approximately in a grid shape. All the adhesive blocks are separated by the hollow region.

A shape of the adhesive block may be a rectangle, or may be a circle, an ellipse, a triangle, a rhombus, or another regular or irregular pattern. The plurality of adhesive blocks may be arranged in an array, or the plurality of adhesive blocks may alternatively be arranged according to another arrangement rule or randomly arranged.

In a possible implementation, the weak adhesive layer includes a plurality of first adhesive blocks and a plurality of second adhesive blocks, an area of the second adhesive block is different from an area of the first adhesive block, and all the first adhesive blocks and the second adhesive blocks are distributed at intervals. A hollow region is formed between two adjacent adhesive blocks. In this implementation, there is one hollow region in the weak adhesive layer, and the hollow region is approximately in a grid shape. All the adhesive blocks are separated by the hollow region.

The first adhesive block and the second adhesive block may have structures of a same shape but different sizes, or may have structures of different shapes. The first adhesive block and the second adhesive block may be rectangles, or may be circles, ellipses, triangles, rhombuses, or other regular or irregular shapes.

In a possible implementation, the weak adhesive layer is of a continuous whole-plane structure, and a shape of the weak adhesive layer changes with shapes of a support surface of the first housing and a support surface of the second housing. In this case, the weak adhesive layer may be made of a material with a relatively small modulus, so that a stiffness of the weak adhesive layer is lower than a stiffness of the strong adhesive layer.

In a possible implementation, a modulus of the strong adhesive layer is equal to a modulus of the weak adhesive layer, and an arrangement area of the strong adhesive layer is greater than an arrangement area of the weak adhesive layer. In this case, a stiffness of the strong adhesive layer is higher than a stiffness of the weak adhesive layer. The weak adhesive layer may be provided with a hollow region having a relatively large area, so that the area of the weak adhesive layer is less than the area of the strong adhesive layer.

In a possible implementation, the flexible display includes a support and a display panel that are disposed in a stacked manner, the support is bonded to the adhesive layer assembly, the support includes a first metal plate part, a second metal plate part, and a third metal plate part that are sequentially arranged, the first metal plate part is located in the first non-bending part, the second metal plate part is located in the bending part, the third metal plate part is located in the second non-bending part, and the second metal plate part can be bent.

In this implementation, the support is a continuous metal plate part, to provide support for the display panel, so that structural strength of the flexible display is relatively high. The second metal plate part can be bent, so that the flexible display can be smoothly bent.

In addition, dislocation can be performed between the support and the display panel, a dislocation requirement between inner-layer structures of the display panel can be reduced, so that the display panel is easier to bend, reliability is higher, and reliability of the flexible display is better.

In a possible implementation, a thickness of the second metal plate part is less than a thickness of the first metal plate part and less than a thickness of the third metal plate part. In this case, structural strength of the second metal plate part is reduced, which helps reduce a bending difficulty, so that the flexible display is easily bent, to improve user experience.

In a possible implementation, one or more hollow holes are disposed in the second metal plate part. In this case, structural strength of the second metal plate part is reduced, which helps reduce a bending difficulty, so that the flexible display is easily bent, to improve user experience.

In a possible implementation, the flexible display further includes a fastening adhesive layer bonded between the display panel and the support. The fastening adhesive layer is partially filled in one or more hollow holes of the second metal plate part, so that a part that is of the flexible display panel and that is located in the bending part has better flatness.

According to a second aspect, an embodiment of this application provides an electronic device. The electronic device includes a housing assembly, a flexible display, and an adhesive layer assembly. The adhesive layer assembly is bonded between the housing assembly and the flexible display. The housing assembly includes a first housing, a first rotating shaft, a second housing, a second rotating shaft, and a third housing that are connected in sequence. The first rotating shaft can deform, so that the first housing and the second housing are unfolded or folded relative to each other, and the second rotating shaft can deform, so that the second housing and the third housing are unfolded or folded relative to each other.

The flexible display includes a first non-bending part, a first bending part, a second non-bending part, a second bending part, and a third non-bending part that are sequentially arranged. The first non-bending part faces the first housing, the first bending part faces the first rotating shaft, the second non-bending part faces the second housing, the second bending part faces the second rotating shaft, and the third non-bending part faces the third housing.

The adhesive layer assembly includes three strong adhesive layers and two weak adhesive layers. A stiffness of the strong adhesive layer is higher than a stiffness of the weak adhesive layer, the two weak adhesive layers are respectively fastened between the first housing and the first bending part and between the third housing and the third non-bending part, and the three strong adhesive layers are located between the two weak adhesive layers. The three strong adhesive layers are respectively fastened between the first housing and the first bending part, between the second housing and the second non-bending part, and between the third housing and the third non-bending part.

In a process in which the first housing, the second housing, and the third housing are folded relative to each other to drive the flexible display to be folded, the flexible display moves to be dislocated relative to the housing assembly due to stress generated by deformation of the bent flexible display. In this case, the first non-bending part is bonded to the first housing by using the strong adhesive layer and the weak adhesive layer, and the strong adhesive layer is disposed close to the first rotating shaft. The second non-bending part is bonded to the second housing by using the strong adhesive layer, the third non-bending part is bonded to the third housing by using the strong adhesive layer and the weak adhesive layer, and the strong adhesive layer is disposed close to the second rotating shaft. In addition, a stiffness of the strong adhesive layer is higher than a stiffness of the weak adhesive layer. Therefore, when the flexible display is folded, a dislocation of the second non-bending part of the flexible display relative to the second housing is relatively small, a dislocation of the first bending part relative to the first housing is relatively small, and a dislocation of the second bending part relative to the third housing is also relatively small, thereby reducing a risk of arching, film layer separation, or an adhesive failure of the flexible display in a process of unfolding the electronic device because the flexible display cannot be fully restored, and improving reliability of the flexible display. In addition, the first non-bending part can follow the first bending part to be dislocated relative to the first housing, the third non-bending part can also follow the second bending part to be dislocated relative to the third housing, and stress between the flexible display and the housing assembly is reduced, thereby reducing a risk of arching, film layer separation or an adhesive failure of the flexible display because a force locally applied to the flexible display is excessively large, and improving the reliability of the flexible display. Therefore, the electronic device is provided with the adhesive layer assembly, to improve the reliability of the flexible display, so that a service life of the electronic device is relatively long, and user experience is better.

In a possible implementation, a modulus of the strong adhesive layer is greater than a modulus of the weak adhesive layer. In this implementation, the strong adhesive layer is made of a material with a relatively large modulus, and the weak adhesive layer is made of a material with a relatively small modulus, so that the stiffness of the strong adhesive layer is higher than the stiffness of the weak adhesive layer, to meet a bonding requirement of the flexible display and the housing assembly.

In a possible implementation, the strong adhesive layer is made of a double-sided adhesive material whose carrier is polyethylene terephthalate, or is made of a hot-melt adhesive material.

In a possible implementation, the weak adhesive layer is made of a double-sided adhesive material whose carrier is foam, or is made of a silica gel material.

In a possible implementation, the weak adhesive layer is made of a double-sided adhesive material without a carrier and with a relatively small modulus.

In a possible implementation, the weak adhesive layer is made of an acrylic-based adhesive material or a rubber-based adhesive material with a relatively small modulus.

In a possible implementation, the strong adhesive layer is in a continuous long strip shape. In this case, an area of the strong adhesive layer is relatively large, which helps implement a relatively high stiffness, to meet a bonding requirement.

In a possible implementation, the weak adhesive layer includes one or more hollow regions, to form a patterned structure. In this case, the stiffness of the weak adhesive layer is relatively low, and is lower than the stiffness of the strong adhesive layer, to meet a bonding requirement.

In a possible implementation, the weak adhesive layer is of a frame structure. The weak adhesive layer includes a hollow region located in the middle. A shape of a frame of the weak adhesive layer changes with shapes of the first non-bending part and the second non-bending part of the flexible display.

In a possible implementation, the weak adhesive layer is of a grid structure. The weak adhesive layer includes a plurality of hollow regions disposed at intervals. The plurality of hollow regions are arranged in an array. The plurality of hollow regions may alternatively be randomly arranged or arranged according to another arrangement rule. A shape of the hollow region may be a rectangle, or may be a circle, an ellipse, a triangle, a rhombus, or another regular or irregular pattern.

In a possible implementation, the weak adhesive layer includes a plurality of long adhesive strips distributed at intervals. A hollow region is formed between two adjacent long adhesive strips. A long side of the long adhesive strip may be a straight line or a wavy line.

In a possible implementation, the weak adhesive layer includes a plurality of adhesive blocks distributed at intervals. A hollow region is formed between two adjacent adhesive blocks. In this implementation, there is one hollow region in the weak adhesive layer, and the hollow region is approximately in a grid shape. All the adhesive blocks are separated by the hollow region.

A shape of the adhesive block may be a rectangle, or may be a circle, an ellipse, a triangle, a rhombus, or another regular or irregular pattern. The plurality of adhesive blocks may be arranged in an array, or the plurality of adhesive blocks may alternatively be arranged according to another arrangement rule or randomly arranged.

In a possible implementation, the weak adhesive layer includes a plurality of first adhesive blocks and a plurality of second adhesive blocks, an area of the second adhesive block is different from an area of the first adhesive block, and all the first adhesive blocks and the second adhesive blocks are distributed at intervals. A hollow region is formed between two adjacent adhesive blocks. In this implementation, there is one hollow region in the weak adhesive layer, and the hollow region is approximately in a grid shape. All the adhesive blocks are separated by the hollow region.

The first adhesive block and the second adhesive block may have structures of a same shape but different sizes, or may have structures of different shapes. The first adhesive block and the second adhesive block may be rectangles, or may be circles, ellipses, triangles, rhombuses, or other regular or irregular shapes.

In a possible implementation, the weak adhesive layer is of a continuous whole-plane structure, and a shape of the weak adhesive layer changes with shapes of a support surface of the first housing and a support surface of the second housing. In this case, the weak adhesive layer may be made of a material with a relatively small modulus, so that a stiffness of the weak adhesive layer is lower than a stiffness of the strong adhesive layer.

In a possible implementation, a modulus of the strong adhesive layer is equal to a modulus of the weak adhesive layer, and an arrangement area of the strong adhesive layer is greater than an arrangement area of the weak adhesive layer. In this case, a stiffness of the strong adhesive layer is higher than a stiffness of the weak adhesive layer. The weak adhesive layer may be provided with a hollow region having a relatively large area, so that the area of the weak adhesive layer is less than the area of the strong adhesive layer.

In a possible implementation, when the first housing, the second housing, and the third housing are folded relative to each other to a closed state, the first housing is located between the second housing and the third housing. In this case, the electronic device is approximately in a rolled structure.

In a possible implementation, when the first housing, the second housing, and the third housing are folded relative to each other to a closed state, the third housing is located between the first housing and the second housing. In this case, the electronic device is approximately in a rolled structure.

In a possible implementation, when the first housing, the second housing, and the third housing are folded relative to each other to a closed state, the second housing is located between the first housing and the third housing. In this case, the electronic device is approximately S-shaped, and when the electronic device is in a closed state, the flexible display is partially folded inwards and partially exposed. Because the flexible display is in a shape when the electronic device is in a closed state, a bending radius difference between layer structures of the flexible display is relatively small, and dislocation statuses of the plurality of film layers of the flexible display at two ends are opposite, so that a dislocation requirement between the plurality of layer structures of the flexible display can be reduced, and reliability of the flexible display is improved.

DESCRIPTION OF EMBODIMENTS

The following describes embodiments of this application with reference to the accompanying drawings in embodiments of this application.

Embodiments of this application provide a foldable electronic device and a rollable electronic device. The electronic device includes a flexible display, a housing assembly, and an adhesive layer assembly fastened between the flexible display and the housing assembly. The adhesive layer assembly includes a strong adhesive layer and a weak adhesive layer, and a stiffness of the strong adhesive layer is higher than a stiffness of the weak adhesive layer. By setting arrangement positions of the strong adhesive layer and the weak adhesive layer, in a process in which the flexible display deforms with the electronic device, a risk of film layer separation or an adhesive failure is relatively low, and reliability of the flexible display is relatively high. This helps prolong a service life of the electronic device and improve user experience.

Figure 1:
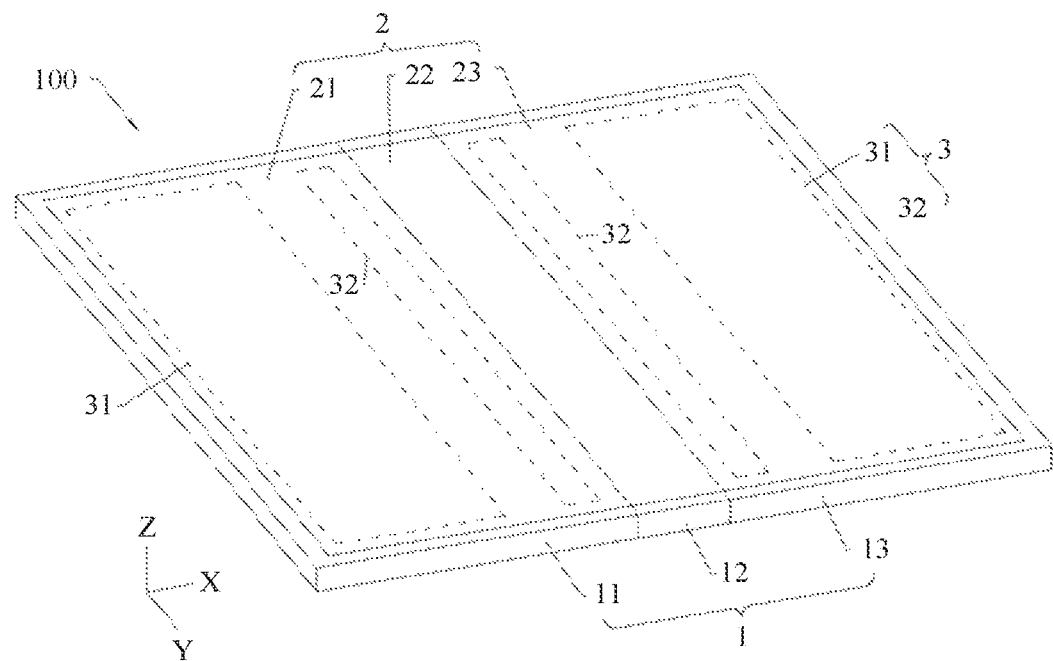
FIG. 1 is a schematic diagram of a structure of an electronic device in an opened state according to an embodiment of this application.
Figure 2:
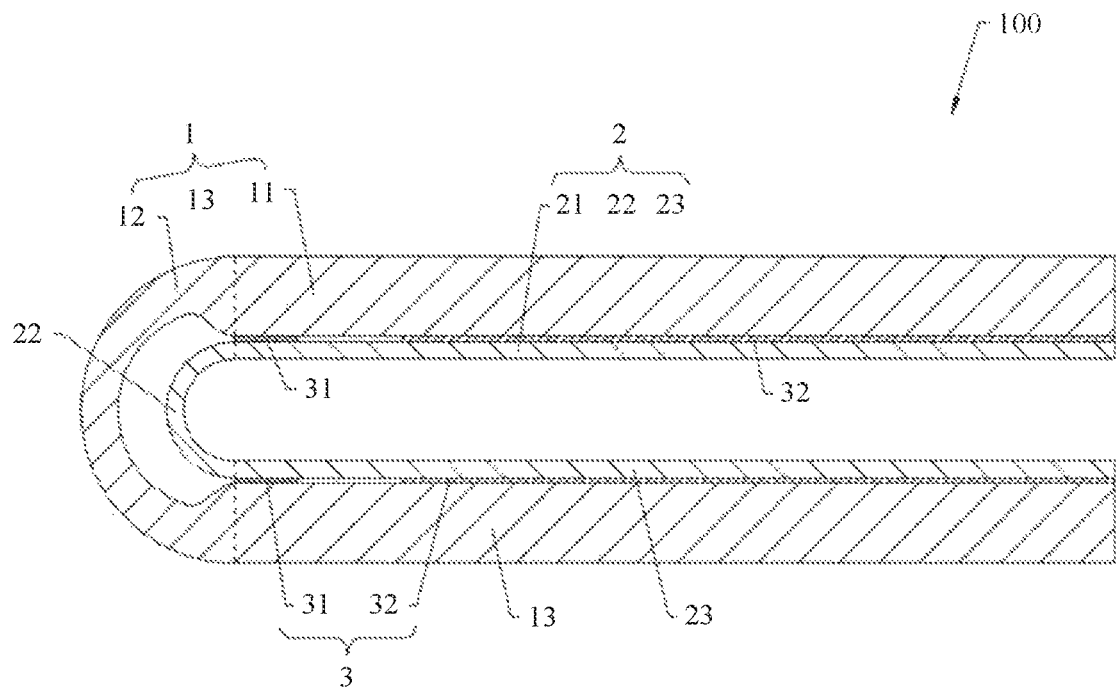
FIG. 2 is a schematic diagram of an internal structure of the electronic device shown in FIG. 1 in a closed state.

Refer to FIG. 1 and FIG. 2 together. FIG. 1 is a schematic diagram of a structure of an electronic device 100 in an opened state according to an embodiment of this application. FIG. 2 is a schematic diagram of an internal structure of the electronic device 100 shown in FIG. 1 in a closed state.

The electronic device 100 is a foldable electronic product. The electronic device 100 may be a mobile phone, a tablet computer, an in-vehicle device, a wearable device, or the like. In the embodiment shown in FIG. 1, descriptions are provided by using an example in which the electronic device 100 is a mobile phone. For ease of description, as shown in FIG. 1, a width direction of the electronic device 100 is defined as an X axis, a length direction of the electronic device 100 is defined as a Y axis, a thickness direction of the electronic device 100 is defined as a Z axis, and the width direction X of the electronic device 100, the length direction Y of the electronic device 100, and the thickness direction Z of the electronic device 100 are perpendicular to each other.

In some embodiments, the electronic device 100 includes a housing assembly 1, a flexible display 2, and an adhesive layer assembly 3. The adhesive layer assembly 3 is bonded between the housing assembly 1 and the flexible display 2. In other words, the flexible display 2 is fastened to the housing assembly 1 by using the adhesive layer assembly 3.

In some embodiments, the housing assembly 1 includes a first housing 11, a rotating shaft 12, and a second housing 13 that are connected in sequence. The rotating shaft 12 can deform, so that the first housing 11 and the second housing 13 are unfolded or folded relative to each other. As shown in FIG. 1, the first housing 11 and the second housing 13 can be unfolded relative to each other to be fully opened, so that the electronic device 100 is in an opened state. For example, when the first housing 11 and the second housing 13 are fully opened, the first housing 11 and the second housing 13 may be approximately 180° (a slight deviation is also allowed, for example, 165°, 177°, or 185°). As shown in FIG. 2, the first housing 11 and the second housing 13 can be folded relative to each other to be closed, so that the electronic device 100 is in a closed state. For example, when the first housing 11 and the second housing 13 are closed, the first housing 11 and the second housing 13 are parallel (a slight deviation is also allowed). In other words, the electronic device 100 may switch between the opened state and the closed state through deformation of the rotating shaft 12. In some embodiments, the electronic device 100 may further be in a partially opened state when the first housing 11 and the second housing 13 are unfolded/folded relative to each other through deformation of the rotating shaft 12, that is, the first housing 11 and the second housing 13 are in an intermediate state between the fully opened state and the closed state. In some other embodiments, when the first housing 11 and the second housing 13 are fully opened, the first housing 1 and the second housing 13 may alternatively be approximately at an obtuse angle such as 120°, 135°, or 150°. This is not strictly limited in this embodiment of this application.

The rotating shaft 12 may be connected to the first housing 11 in a movable or fixed manner, the rotating shaft 12 may be connected to the second housing 13 in a movable or fixed manner, and the movable connection may include a rotating connection and/or a sliding connection. The rotating shaft 12 may include a plurality of components that are connected to each other in a movable or fixed manner. For example, the rotating shaft 12 may include but is not limited to one or more of a hinge, a sliding block, a chute, a pin shaft, a connecting rod, and a swing rod. Alternatively, the rotating shaft 12 may be made of an elastic material, a memory alloy material, or the like. A specific implementation of the rotating shaft 12 is not strictly limited in this application. In embodiments of this application, "A and/or B" includes three cases: "A". "B", and "A and B".

In some embodiments, the flexible display 2 is configured to display an image. For example, the flexible display 2 may be an organic light-emitting diode (organic light-emitting diode, OLED) display, an active-matrix organic light-emitting diode (active-matrix organic light-emitting diode, AMOLED) display, a mini light-emitting diode (mini light-emitting diode) display, a micro light-emitting diode (micro light-emitting diode) display, a micro organic light-emitting diode (micro organic light-emitting diode) display, or a quantum dot light-emitting diode (quantum dot light-emitting diode, QLED) display.

In some embodiments, the flexible display 2 includes a first non-bending part 21, a bending part 22, and a second non-bending part 23 that are sequentially arranged. The flexible display 2 may be of a continuous and integrated display structure, and the first non-bending part 21, the bending part 22, and the second non-bending part 23 each are a part of the flexible display 2. The first non-bending part 21 faces the first housing 11, the bending part 22 faces the rotating shaft 12, and the second non-bending part 23 faces the second housing 13. The flexible display 2 is unfolded or folded with the housing assembly 1. As shown in FIG. 2, when the first housing 11 and the second housing 13 are folded relative to each other to a closed state, the flexible display 2 is located inside the housing assembly 1. For example, when the first housing 11 and the second housing 13 are folded relative to each other to a closed state, the first non-bending part 21 is parallel to the second non-bending part 23, and the flexible display 2 is approximately U-shaped.

In this embodiment, the flexible display 2 can be unfolded or folded with the housing assembly 1. When the electronic device 100 is in an opened state, the flexible display 2 is unfolded and flattened, and can perform display in full screen, so that the electronic device 100 has a relatively large display area, to improve viewing experience of a user. When the electronic device 100 is in a closed state, the flexible display 2 is folded inside the housing assembly 1, and a planar size of the electronic device 100 is relatively small, helping the user carry and store the electronic device.

In some embodiments, an adhesive layer of the adhesive layer assembly 3 may use one or more of a double-sided tape, an acrylic-based adhesive material, a rubber-based adhesive material, or a silicone-based adhesive material. A process for fastening the adhesive layer of the adhesive layer assembly 3 may be an ultraviolet (ultraviolet, UV) curing process, a moisture curing process, a heat curing process, an infrared curing process, or the like. A specific material and a specific forming process of the adhesive layer of the adhesive layer assembly 3 are not strictly limited in this application.

In some embodiments, the adhesive layer assembly 3 includes two strong adhesive layers 31 and two weak adhesive layers 32. A stiffness of the strong adhesive layer 31 is higher than a stiffness of the weak adhesive layer 32. In this embodiment of this application, "stiffness" is used to indicate a capability of the adhesive layer to resist elastic deformation when a force is applied to the adhesive layer. In other words, when being subject to an external force, the strong adhesive layer 31 is less likely to deform than the weak adhesive layer 32. It should be understood that, in this embodiment of this application, the weak adhesive layer 32 is relatively low in stiffness compared with the strong adhesive layer 31, and this is not limited to that the weak adhesive layer 32 has a very low stiffness. Similarly, compared with the weak adhesive layer 32, the strong adhesive layer 31 has a relatively high stiffness, which is not limited to that the strong adhesive layer 31 has a very high stiffness.

One strong adhesive layer 31 and one weak adhesive layer 32 are bonded between the first non-bending part 21 and the first housing 11, and the other strong adhesive layer 31 and the other weak adhesive layer 32 are bonded between the second non-bending part 23 and the second housing 13. In the two adhesive layers fastened to the first non-bending part 21, the strong adhesive layer 31 is close to the bending part 22 relative to the weak adhesive layer 32. In the two adhesive layers fastened to the second non-bending part 23, the strong adhesive layer 31 is close to the bending part 22 relative to the weak adhesive layer 32. That is, the strong adhesive layer 31 is close to the rotating shaft 12 relative to the adjacent weak adhesive layer 32.

In a process in which the first housing 11 and the second housing 13 are folded relative to each other to drive the flexible display 2 to be folded, the flexible display 2 moves to be dislocated relative to the housing assembly 1 due to stress generated by deformation of the bent flexible display 2. For example, the flexible display 2 may be close to or away from the rotating shaft 12 relative to the housing assembly 1. In this case, the first non-bending part 21 is bonded to the first housing 11 by using the strong adhesive layer 31 and the weak adhesive layer 32, and the strong adhesive layer 31 is disposed close to the rotating shaft 12. The second non-bending part 23 is bonded to the second housing 13 by using the strong adhesive layer 31 and the weak adhesive layer 32, and the strong adhesive layer 31 is disposed close to the rotating shaft 12. In addition, the stiffness of the strong adhesive layer 31 is higher than the stiffness of the weak adhesive layer 32. Therefore, when the flexible display 2 is folded, a dislocation of the bending part 22 of the flexible display 2 relative to the housing assembly 1 is relatively small, thereby reducing a risk of arching, film layer separation, or an adhesive failure of the flexible display 2 in a process of unfolding the electronic device 100 because the flexible display 2 cannot be fully restored, and improving reliability of the flexible display 2. In addition, the first non-bending part 21 can follow the bending part 22 to be dislocated relative to the first housing 11, the second non-bending part 23 can also follow the bending part 22 to be dislocated relative to the second housing 13, and stress between the flexible display 2 and the housing assembly 1 is reduced, thereby reducing a risk of arching, film layer separation, or an adhesive failure of the flexible display 2 because a force locally applied to the flexible display is excessively large, and improving the reliability of the flexible display 2. Therefore, the electronic device 100 is provided with the adhesive layer assembly 3, to improve the reliability of the flexible display 2, so that a service life of the electronic device 100 is relatively long, and user experience is better.

It may be understood that when the flexible display 2 is folded or unfolded with the housing assembly 1, the flexible display 2 moves slightly in a staggered manner relative to the housing assembly 1, and a movement direction of the flexible display 2 is related to specific designs (for example, parameters such as a structure, a size, and a location) of the flexible display 2, the adhesive layer assembly 3, and the housing assembly 1. For example, when the flexible display 2 is folded with the housing assembly 1, the first non-bending part 21 of the flexible display 2 moves in a direction away from the rotating shaft 12 relative to the first housing 11, and the second non-bending part 23 moves in a direction away from the rotating shaft 12 relative to the second housing 13.

According to the applicant, by using a normal-temperature dynamic bending test structure, after bending and unfolding for 200,000 times, a fault probability of a display of a conventional electronic device 100 is 3/8, but a fault probability of the flexible display 2 of the electronic device 100 in this application is 0/8. Therefore, the reliability of the flexible display 2 of the electronic device 100 in this application is significantly improved.

In this embodiment of this application, there may be a plurality of embodiments for the strong adhesive layer 31 and the weak adhesive layer 32 in the adhesive layer assembly 3, and a stiffness requirement may be met by using a material design, a shape design, and/or the like. The following provides an example for description.

In some embodiments, a modulus of the strong adhesive layer 31 is greater than a modulus of the weak adhesive layer 32. In this embodiment of this application, a "modulus" is used to indicate a capability of a material to resist elastic deformation when a force is applied to the material. In this embodiment, the strong adhesive layer 31 is made of a material with a relatively large modulus, and the weak adhesive layer 32 is made of a material with a relatively small modulus, so that a stiffness of the strong adhesive layer 31 is higher than a stiffness of the weak adhesive layer 32, to meet a bonding requirement of the flexible display 2 and the housing assembly 1.

For example, the strong adhesive layer 31 may be made of a double-sided adhesive material whose carrier is polyethylene terephthalate and whose modulus is relatively large; or the strong adhesive layer 31 may also be made of a hot-melt adhesive material whose modulus is relatively large. In some other embodiments, the strong adhesive layer 31 may also be made of another material with a relatively large modulus.

For example, the weak adhesive layer 32 may be made of a double-sided adhesive material whose carrier is foam and whose modulus is relatively small; or the weak adhesive layer 32 may also be made of a silica gel material. In some other embodiments, the weak adhesive layer 32 may alternatively be made of a double-sided adhesive material without a carrier and with a relatively small modulus. In some other embodiments, the weak adhesive layer 32 may alternatively be made of an acrylic-based adhesive material or a rubber-based adhesive material with a relatively small modulus. In some other embodiments, the weak adhesive layer 32 may alternatively be made of another material with a relatively small modulus.

In some embodiments, as shown in FIG. 1, the strong adhesive layer 31 is in a continuous long strip shape. In this case, an area of the strong adhesive layer 31 is relatively large, which helps implement a relatively high stiffness, to meet a bonding requirement.

In some embodiments, as shown in FIG. 1, the weak adhesive layer 32 is of a continuous whole-plane structure. In this case, the weak adhesive layer 32 may be made of a material with a relatively small modulus, so that a stiffness of the weak adhesive layer 32 is lower than a stiffness of the strong adhesive layer 31.

In some other embodiments, the weak adhesive layer 32 includes one or more hollow regions, to form a patterned structure. In this case, a stiffness of the weak adhesive layer 32 is relatively low, and is lower than a stiffness of the strong adhesive layer 31, to meet a bonding requirement.

Figure 3:
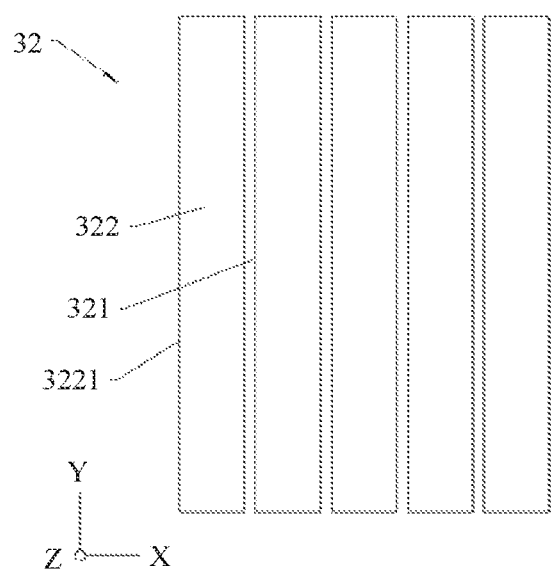
FIG. 3 shows a structure of a weak adhesive layer of the electronic device shown in FIG. 1 in some other embodiments.

For example, refer to FIG. 3. FIG. 3 shows a structure of the weak adhesive layer 32 of the electronic device 100 shown in FIG. 1 in some other embodiments. The weak adhesive layer 32 includes a plurality of long adhesive strips 322 distributed at intervals. A hollow region 321 is formed between two adjacent long adhesive strips 322. The plurality of long adhesive strips 322 may be arranged in a width direction X of the electronic device 100, and each long adhesive strip 322 extends in a length direction Y of the electronic device 100. In some other embodiments, the plurality of long adhesive strips 322 may alternatively be arranged in another direction (for example, the length direction Y of the electronic device 100), and each long adhesive strip 322 may alternatively extend in another direction (for example, the width direction X of the electronic device 100). This is not strictly limited in this application.

For example, when widths (namely, sizes in the width direction X of the electronic device 100) of the first non-bending part 21 and the second non-bending part 23 are greater than or equal to 30 millimeters, a width of the hollow region 321 may be about 0.2 millimeters, for example, may be in a range of 0.1 millimeters to 0.3 millimeters.

A long side 3221 of the long adhesive strip 322 is a straight line, to reduce manufacturing difficulty and manufacturing costs of the long adhesive strip 322.

Figure 4:
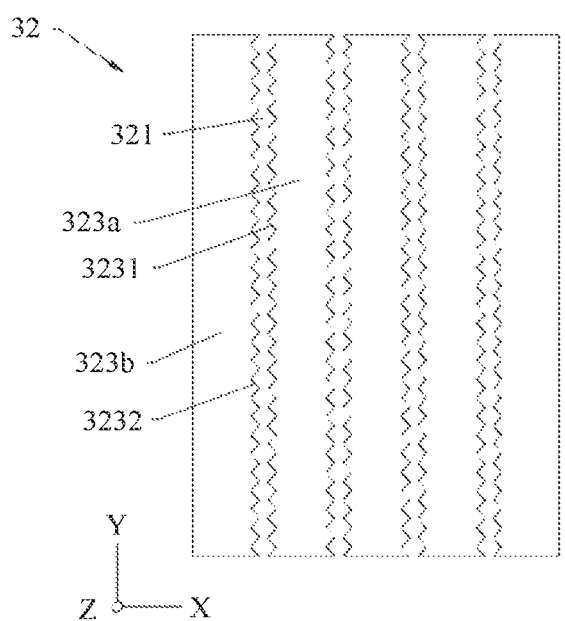
FIG. 4 shows a structure of a weak adhesive layer of the electronic device shown in FIG. 1 in some still other embodiments.

For example, refer to FIG. 4. FIG. 4 shows a structure of the weak adhesive layer 32 of the electronic device 100 shown in FIG. 1 in some still other embodiments. The weak adhesive layer 32 in this embodiment includes most features of the weak adhesive layer 32 in the foregoing embodiments. The following mainly describes differences between the weak adhesive layer 32 in this embodiment and the weak adhesive layer 32 in the foregoing embodiments, and most same content is not described again.

The weak adhesive layer 32 includes a plurality of long adhesive strips (323a/323b) distributed at intervals. A hollow region 321 is formed between two adjacent long adhesive strips (323a/323b). Two long sides 3231 of the plurality of long adhesive strips 323a located in the middle are triangular wavy lines, and one long side 3232 of each of two long adhesive strips 323b located on the two sides is a triangular wavy line. In some other embodiments, one or more of four sides of the long adhesive strip (323a/323b) may be set as wavy lines. The sides of all or some of the plurality of long adhesive strips (323a/323b) may be set as wavy lines. In some other embodiments, the long side of the long adhesive strip (323a/323b) may alternatively be in an arc wavy shape, a rectangular wavy shape, or the like.

Figure 5:
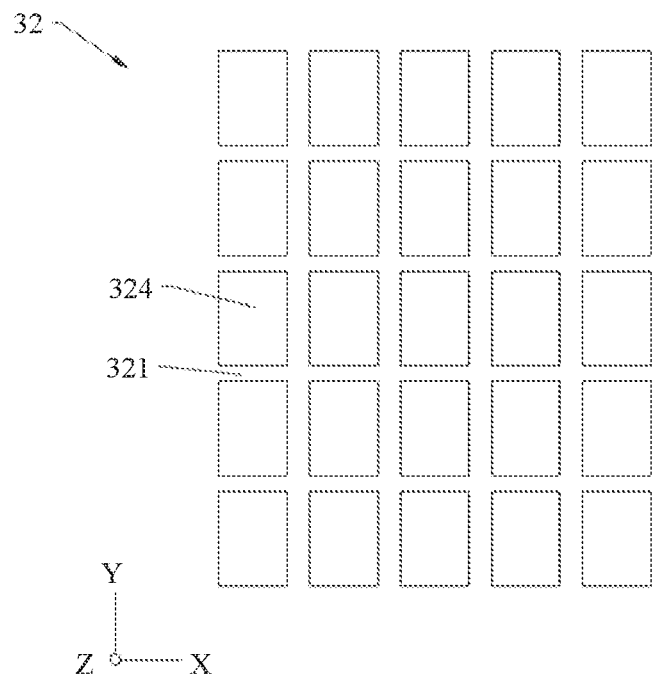
FIG. 5 shows a structure of a weak adhesive layer of the electronic device shown in FIG. 1 in some yet other embodiments.

For example, refer to FIG. 5. FIG. 5 shows a structure of the weak adhesive layer 32 of the electronic device 100 shown in FIG. 1 in some yet other embodiments. The weak adhesive layer 32 in this embodiment includes most features of the weak adhesive layer 32 in the foregoing embodiments. The following mainly describes differences between the weak adhesive layer 32 in this embodiment and the weak adhesive layer 32 in the foregoing embodiments, and most same content is not described again.

The weak adhesive layer 32 includes a plurality of adhesive blocks 324 distributed at intervals. A hollow region 321 is formed between two adjacent adhesive blocks 324. In this embodiment, there is one hollow region 321 in the weak adhesive layer 32, and the hollow region 321 is approximately in a grid shape. All the adhesive blocks 324 are separated by the hollow region 321.

A shape of the adhesive block 324 may be a rectangle shown in FIG. 5, or may be a circle, an ellipse, a triangle, a rhombus, or another regular or irregular pattern. This is not strictly limited in this application.

The plurality of adhesive blocks 324 may be arranged in an array. In some other embodiments, the plurality of adhesive blocks 324 may alternatively be arranged according to another arrangement rule or randomly arranged.

Figure 6:
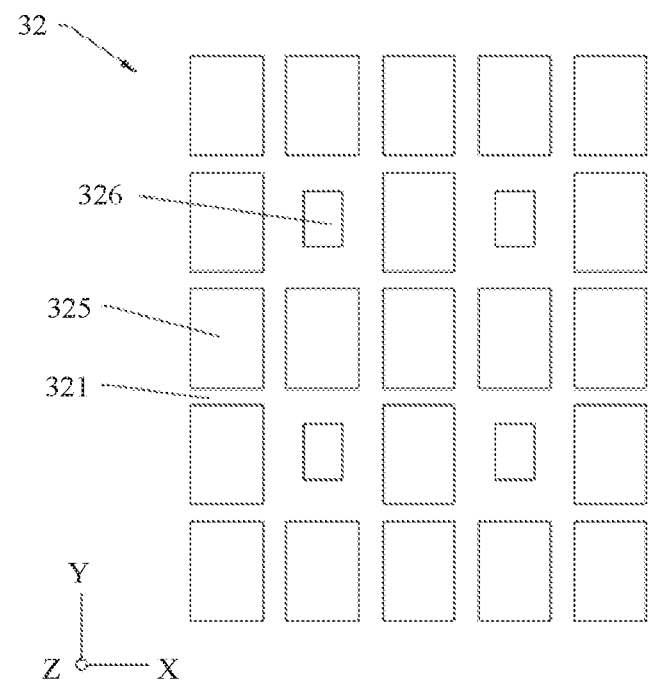
FIG. 6 shows a structure of a weak adhesive layer of the electronic device shown in FIG. 1 in some still yet other embodiments.

For example, refer to FIG. 6. FIG. 6 shows a structure of the weak adhesive layer 32 of the electronic device 100 shown in FIG. 1 in some still yet other embodiments. The weak adhesive layer 32 in this embodiment includes most features of the weak adhesive layer 32 in the foregoing embodiments. The following mainly describes differences between the weak adhesive layer 32 in this embodiment and the weak adhesive layer 32 in the foregoing embodiments, and most same content is not described again.

The weak adhesive layer 32 includes a plurality of first adhesive blocks 325 and a plurality of second adhesive blocks 326. An area of the second adhesive block 326 is different from an area of the first adhesive block 325, and all the first adhesive blocks 325 and the second adhesive blocks 326 are distributed at intervals. A hollow region 321 is formed between two adjacent adhesive blocks (325 and 326). In this embodiment, there is one hollow region 321 in the weak adhesive layer 32, and the hollow region 321 is approximately in a grid shape. All the adhesive blocks (325 and 326) are separated by the hollow region 321.

The first adhesive block 325 and the second adhesive block 326 may have structures of a same shape but different sizes, or may have structures of different shapes. This is not strictly limited in this embodiment of this application. The first adhesive block 325 and the second adhesive block 326 may be rectangles shown in FIG. 6, or may be circles, ellipses, triangles, rhombuses, or other regular or irregular shapes. This is not strictly limited in this embodiment of this application.

Figure 7A:
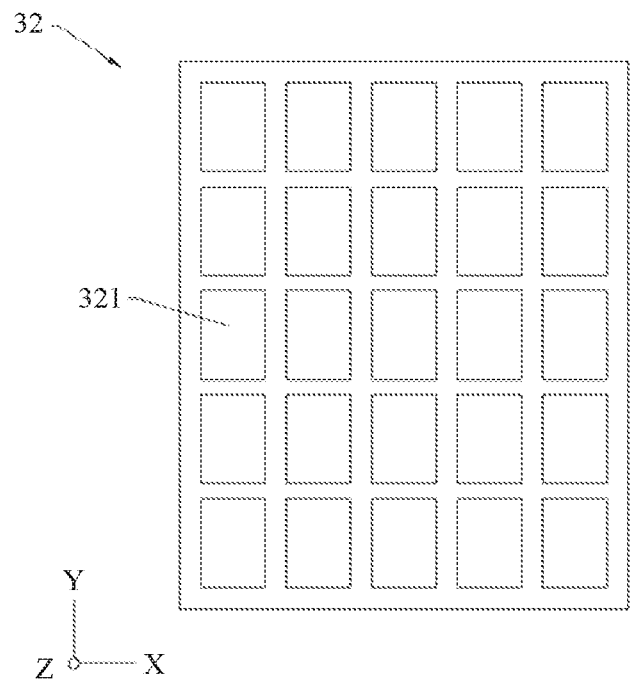
FIG. 7A shows a structure of a weak adhesive layer of the electronic device shown in FIG. 1 in some further embodiments.

For example, refer to FIG. 7A. FIG. 7A shows a structure of the weak adhesive layer 32 of the electronic device 100 shown in FIG. 1 in some further embodiments. The weak adhesive layer 32 in this embodiment includes most features of the weak adhesive layer 32 in the foregoing embodiments. The following mainly describes differences between the weak adhesive layer 32 in this embodiment and the weak adhesive layer 32 in the foregoing embodiments, and most same content is not described again.

The weak adhesive layer 32 is of a grid structure. The weak adhesive layer 32 includes a plurality of hollow regions 321 disposed at intervals. The plurality of hollow regions 321 are arranged in an array. A shape of the hollow region 321 may be a rectangle shown in FIG. 12, or may be a circle, an ellipse, a triangle, a rhombus, or another regular or irregular pattern. This is not strictly limited in this embodiment of this application.

In some other embodiments, the plurality of hollow regions 321 of the weak adhesive layer 32 may be arranged according to another arrangement rule or randomly arranged.

Figure 7B:
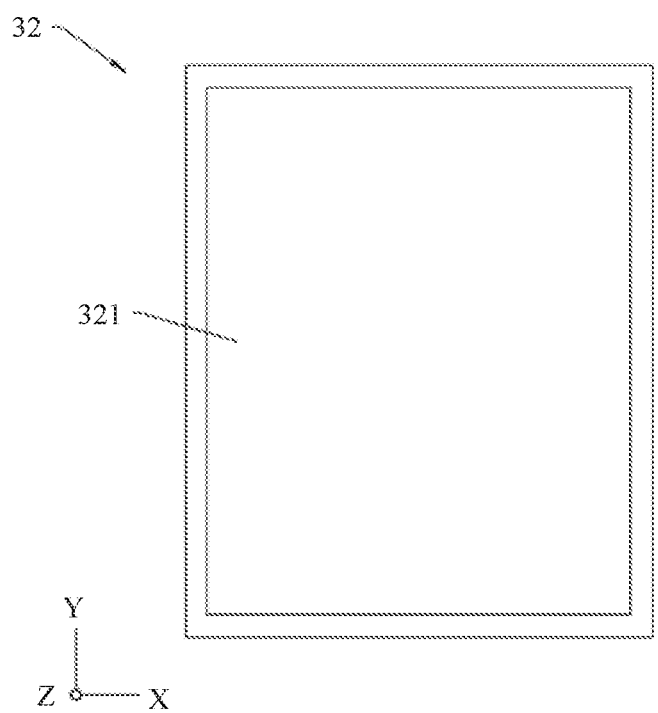
FIG. 7B shows a structure of a weak adhesive layer of the electronic device shown in FIG. 1 in some still further embodiments.

For example, refer to FIG. 7B. FIG. 7B shows a structure of the weak adhesive layer 32 of the electronic device 100 shown in FIG. 1 in some still further embodiments. The weak adhesive layer 32 in this embodiment includes most features of the weak adhesive layer 32 in the foregoing embodiments. The following mainly describes differences between the weak adhesive layer 32 in this embodiment and the weak adhesive layer 32 in the foregoing embodiments, and most same content is not described again.

The weak adhesive layer 32 is of a frame structure. The weak adhesive layer 32 includes a hollow region 321 located in the middle. A shape of a frame of the weak adhesive layer 32 changes with shapes of the first non-bending part 11 and the second non-bending part 15 (refer to FIG. 3) of the flexible display 1. For example, if the first non-bending part 11 is rectangular, the weak adhesive layer 32 is a rectangular frame.

In some other embodiments, a modulus of the strong adhesive layer 31 is equal to a modulus of the weak adhesive layer 32, and an arrangement area of the strong adhesive layer 31 is greater than an arrangement area of the weak adhesive layer 32. In this case, a stiffness of the strong adhesive layer 31 is higher than a stiffness of the weak adhesive layer 32. The weak adhesive layer 32 may be provided with a hollow region having a relatively large area, so that the area of the weak adhesive layer 32 is less than the area of the strong adhesive layer 31.

The foregoing describes several implementations of the weak adhesive layer 32 by using examples. It may be understood that the weak adhesive layer 32 may alternatively have another implementation, for example, another adhesive layer division manner or another arrangement pattern. This is not strictly limited in this application.

In this embodiment of this application, when the electronic device 100 is in a closed state, the bent flexible display 2 is slightly dislocated relative to the housing assembly 1, and a plurality of layer structures of the flexible display 2 are also slightly dislocated relative to each other.

Figure 8:
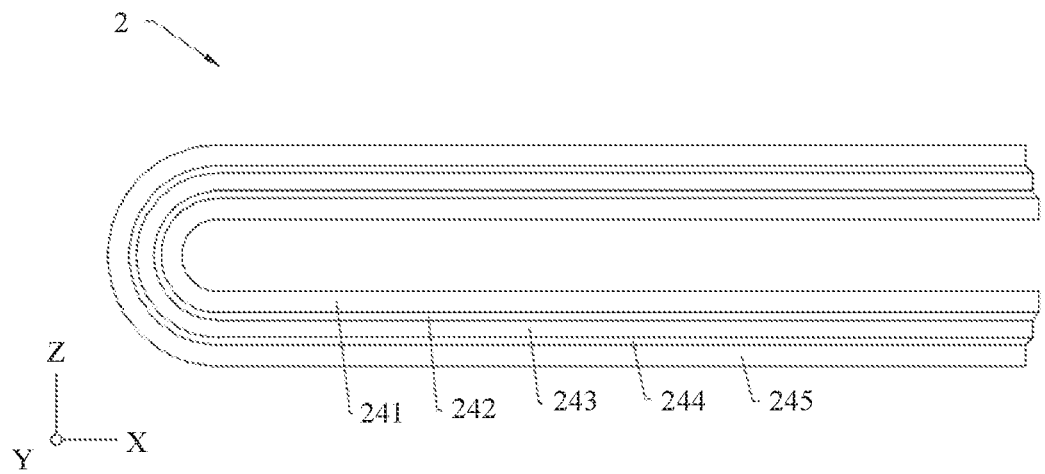
FIG. 8 is a schematic diagram of a structure of a flexible display of the electronic device shown in FIG. 1 in some embodiments.

Refer to FIG. 8. FIG. 8 is a schematic diagram of a structure of the flexible display 2 of the electronic device 100 shown in FIG. 1 in some embodiments. The flexible display 2 in FIG. 8 is in a closed state.

In some embodiments, the flexible display 2 includes a plurality of film layers that are disposed in a stacked manner, and adhesive layers, and each adhesive layer is located between any adjacent film layers located on two sides and is configured to implement bonding and fastening. For example, in the embodiment of FIG. 8, the plurality of film layers and the plurality of adhesive layers are simplified into a first film layer 241, a first adhesive layer 242, a second film layer 243, a second adhesive layer 244, and a third film layer 245 that are sequentially disposed in a stacked manner. The third film layer 245 is configured to be fastened to the adhesive layer assembly 3.

When the flexible display 2 is bent, due to different bending radiuses, layer structures of the flexible display 2 may move to be dislocated relative to each other, to maintain constant lengths of the layer structures. Dislocation deformation between materials of the plurality of layers is mainly absorbed by a low-modulus material of a layer (for example, an adhesive layer), to reduce a risk of film layer separation or an adhesive failure caused by the fact that the flexible display 2 cannot meet a corresponding dislocation movement requirement or stress strain.

In the embodiment of FIG. 8, for example, at an end part of the flexible display 2, the first film layer 241 protrudes relative to the second film layer 243, the second film layer 243 protrudes relative to the third film layer 245, and the first adhesive layer 242 and the second adhesive layer 244 deform. In other words, a layer structure inside the flexible display 2 is dislocated in a direction of approaching the end part of the flexible display 2, relative to a layer structure outside the flexible display. A modulus of the first adhesive layer 242 and a modulus of the second adhesive layer 244 are less than a modulus of the first film layer 241, a modulus of the second film layer 243, and a modulus of the third film layer 245. In other words, a stiffness of these adhesive layers is less than a stiffness of the film layers. Deformation of these adhesive layers enables smooth dislocation between the plurality of film layers, thereby reducing a risk of film layer separation or an adhesive failure of the flexible display 2, and improving reliability of the flexible display 2.

Figure 9:
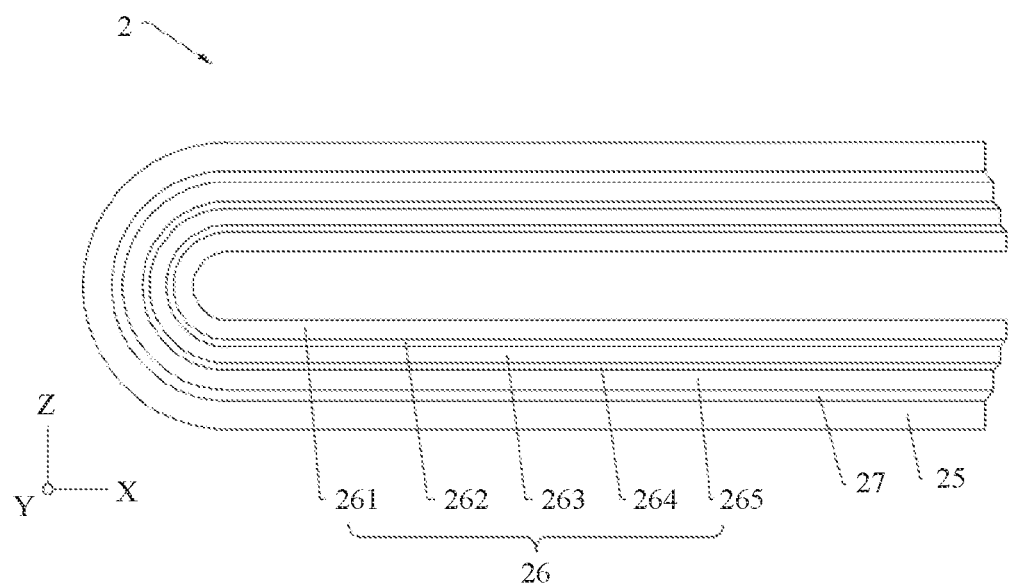
FIG. 9 is a schematic diagram of a structure of a flexible display of the electronic device shown in FIG. 1 in some other embodiments.

Refer to FIG. 9. FIG. 9 is a schematic diagram of a structure of the flexible display 2 of the electronic device 100 shown in FIG. 1 in some other embodiments. The flexible display 2 in FIG. 9 is in a closed state.

In some embodiments, the flexible display 2 includes a support 25 and a display panel 26 that are disposed in a stacked manner. The support 25 is located on a non-display side of the display panel 26. When the flexible display 2 is bent, the support 25 is located outside the display panel 26. The support 25 is configured to bond the strong adhesive layer 31 and the weak adhesive layer 32. The support 25 is fixedly bonded to the display panel 26 by using a fastening adhesive layer 27.

The display panel 26 includes a plurality of film layers disposed in a stacked manner, and adhesive layers, and each adhesive layer is located between any adjacent film layers located on two sides and is configured to implement bonding and fastening. For example, in the embodiment of FIG. 9, the plurality of film layers and the plurality of adhesive layers are simplified into a first film layer 261, a first adhesive layer 262, a second film layer 263, a second adhesive layer 264, and a third film layer 265 that are sequentially disposed in a stacked manner. The third film layer 265 is bonded to the support 25.

When the flexible display 2 is bent, due to different bending radiuses, layer structures of the flexible display 2 may move to be dislocated relative to each other, to maintain constant lengths of the layer structures. Dislocation deformation between materials of the plurality of layers is mainly absorbed by a low-modulus material of a layer (for example, an adhesive layer), to reduce a risk of film layer separation or an adhesive failure caused by the fact that the flexible display 2 cannot meet a corresponding dislocation movement requirement or stress strain.

In the embodiment in FIG. 9, for example, at an end of the flexible display 2, the first film layer 261 protrudes relative to the second film layer 263, the second film layer 263 protrudes relative to the third film layer 265, the third film layer 265 protrudes relative to the support 25, and the fastening adhesive layer 27, the second adhesive layer 264, and the first adhesive layer 262 deform. In other words, a layer structure inside the flexible display 2 is dislocated in a direction of approaching the end part of the flexible display 2, relative to a layer structure outside the flexible display. A modulus of the first adhesive layer 262, a modulus of the second adhesive layer 264, and a modulus of the fastening adhesive layer 27 are less than a modulus of the first film layer 261, a modulus of the second film layer 263, a modulus of the third film layer 265, and a modulus of the support 25. In other words, a stiffness of these adhesive layers is less than a stiffness of the film layers and a stiffness of the support 25. Deformation of these adhesive layers enables smooth dislocation between the plurality of film layers and between the film layers and the support 25, thereby reducing a risk of film layer separation or an adhesive failure of the flexible display 2, and improving reliability of the flexible display 2. In addition, because dislocation can be performed between the support 25 and the display panel 26, a dislocation requirement between inner-layer structures of the display panel 26 can be reduced, so that the display panel 26 is easier to bend, and reliability is higher.

Figure 10:
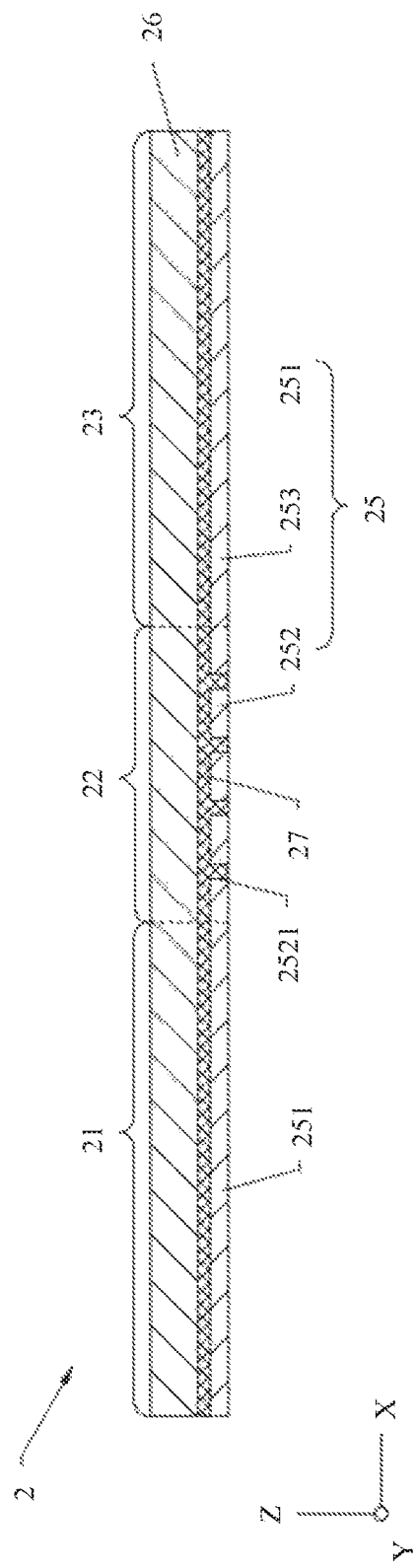
FIG. 10 is a schematic diagram of an internal structure of the flexible display shown in FIG. 9 in another use state.

Refer to FIG. 10. FIG. 10 is a schematic diagram of an internal structure of the flexible display 2 shown in FIG. 9 in another use state. The flexible display 2 in FIG. 10 is in an opened state.

In some embodiments, the support 25 includes a first metal plate part 251, a second metal plate part 252, and a third metal plate part 253 that are sequentially arranged. The first metal plate part 251 is located in the first non-bending part 21, the second metal plate part 252 is located in the bending part 22, the third metal plate part 253 is located in the second non-bending part 23, and the second metal plate part 252 can be bent.

In this embodiment, the support 25 is a continuous metal plate part, to provide support for the display panel 26, so that structural strength of the flexible display 2 is relatively high. The second metal plate part 252 can be bent, so that the flexible display 2 can be smoothly bent.

In some embodiments, one or more hollow holes 2521 are disposed in the second metal plate part 252. In this case, structural strength of the second metal plate part 252 is reduced, which helps reduce a bending difficulty, so that the flexible display 2 is easily bent, to improve user experience.

For example, the fastening adhesive layer 27 bonded between the display panel 26 and the support 25 can be partially filled in the one or more hollow holes 2521 of the second metal plate part 252, so that a part that is of the flexible display panel 26 and that is located in the bending part 22 has better flatness.

In some other embodiments, a thickness of the second metal plate part 252 is less than a thickness of the first metal plate part 251 and less than a thickness of the third metal plate part 253. In this case, structural strength of the second metal plate part 252 is reduced, which helps reduce a bending difficulty, so that the flexible display 2 is easily bent, to improve user experience.

It may be understood that structural strength of a part that is of the support 25 and that is located in the bending part 22 of the flexible display 2 is relatively low, and structural strength of a part that is of the support 25 and that is located in a non-bending part 22 of the flexible display 2 is relatively high. The support 25 may have a plurality of design structures. This is not strictly limited in this application.

In some embodiments, a touch function may also be integrated into the flexible display 2, and the flexible display 2 can generate a touch signal based on a touch operation of a user. For example, a touch layer is integrated into the display panel 26, to integrate a display function and a touch function. Alternatively, the flexible display 2 may further include a touch panel. The touch panel and the display panel 26 are disposed in a stacked manner, and may be fastened to an out-light side of the display panel 26.

In some embodiments, the electronic device 100 may further include a processor (not shown in the figure) mounted in the housing assembly 1, and the flexible display 2 is coupled to the processor. The processor is configured to control a display operation of the flexible display 2. The electronic device 100 further includes one or more functional modules that are mounted in the housing assembly 1 and that are coupled to the processor. The processor is further configured to control operations of the one or more functional modules. The functional module may include but is not limited to a camera module, a speaker module, a microphone module, a sensor module, a wireless communication module, and the like. A function of the processor of the electronic device 100, a quantity of functional modules, a type of a functional module, and the like are not strictly limited in this application.

Figure 11:
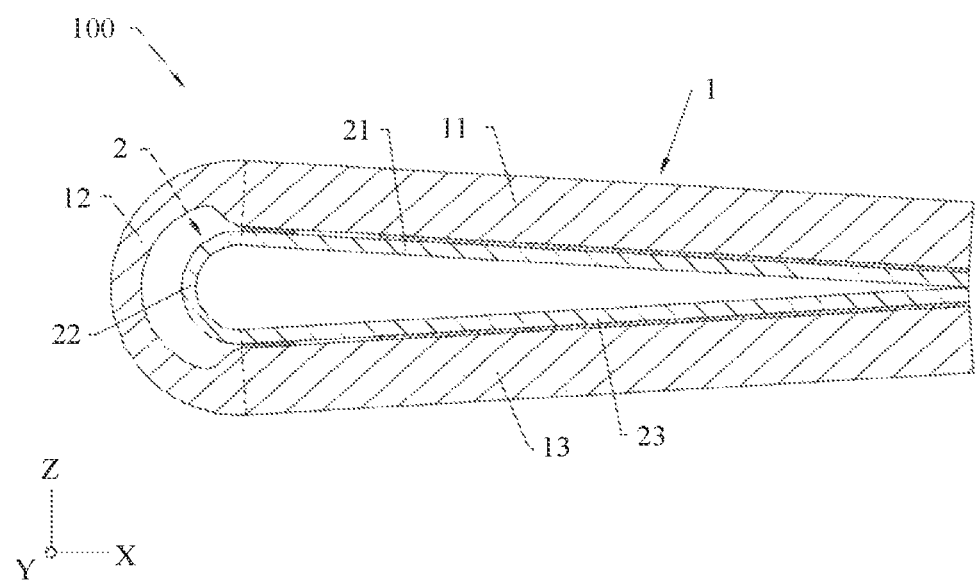
FIG. 11 is a schematic diagram of an internal structure of another electronic device in a closed state according to an embodiment of this application.

Refer to FIG. 11. FIG. 11 is a schematic diagram of an internal structure of another electronic device 100 in a closed state according to an embodiment of this application. The electronic device 100 in this embodiment includes most features of the electronic device 100 in the foregoing embodiments. The following mainly describes differences between the electronic device 100 in this embodiment and the electronic device 100 in the foregoing embodiments, and most same content is not described again.

In some embodiments, when a first housing 11 and a second housing 13 of a housing assembly 1 are folded relative to each other to a closed state, the first housing 11 and the second housing 13 approach each other in a direction away from a rotating shaft 12. For example, an end part of the first housing 1I connected to the rotating shaft 12 and an end part of the second housing 13 connected to the rotating shaft 12 are disposed at intervals, and an end part of the first housing 11 away from the rotating shaft 12 and an end part of the second housing 13 away from the rotating shaft 12 may be in contact with each other. In this embodiment, when the electronic device 100 is in a closed state, an overall size of the electronic device 100 is relatively small. This helps improve carrying and storing convenience.

When the first housing 11 and the second housing 13 are folded relative to each other to a closed state, a first non-bending part 21 and a second non-bending part 23 of a flexible display 2 approach each other in a direction away from a bending part 22. The entire flexible display 2 is generally in a narrow and long water drop shape.

It may be understood that the electronic device 100 further includes an adhesive layer assembly fixedly disposed between the flexible display 2 and the housing assembly 1. In a case of no conflict, the housing assembly 1, the flexible display 2, and the adhesive layer assembly of the electronic device 100 in this embodiment may all be designed with reference to related descriptions in the foregoing embodiments.

Figure 12:
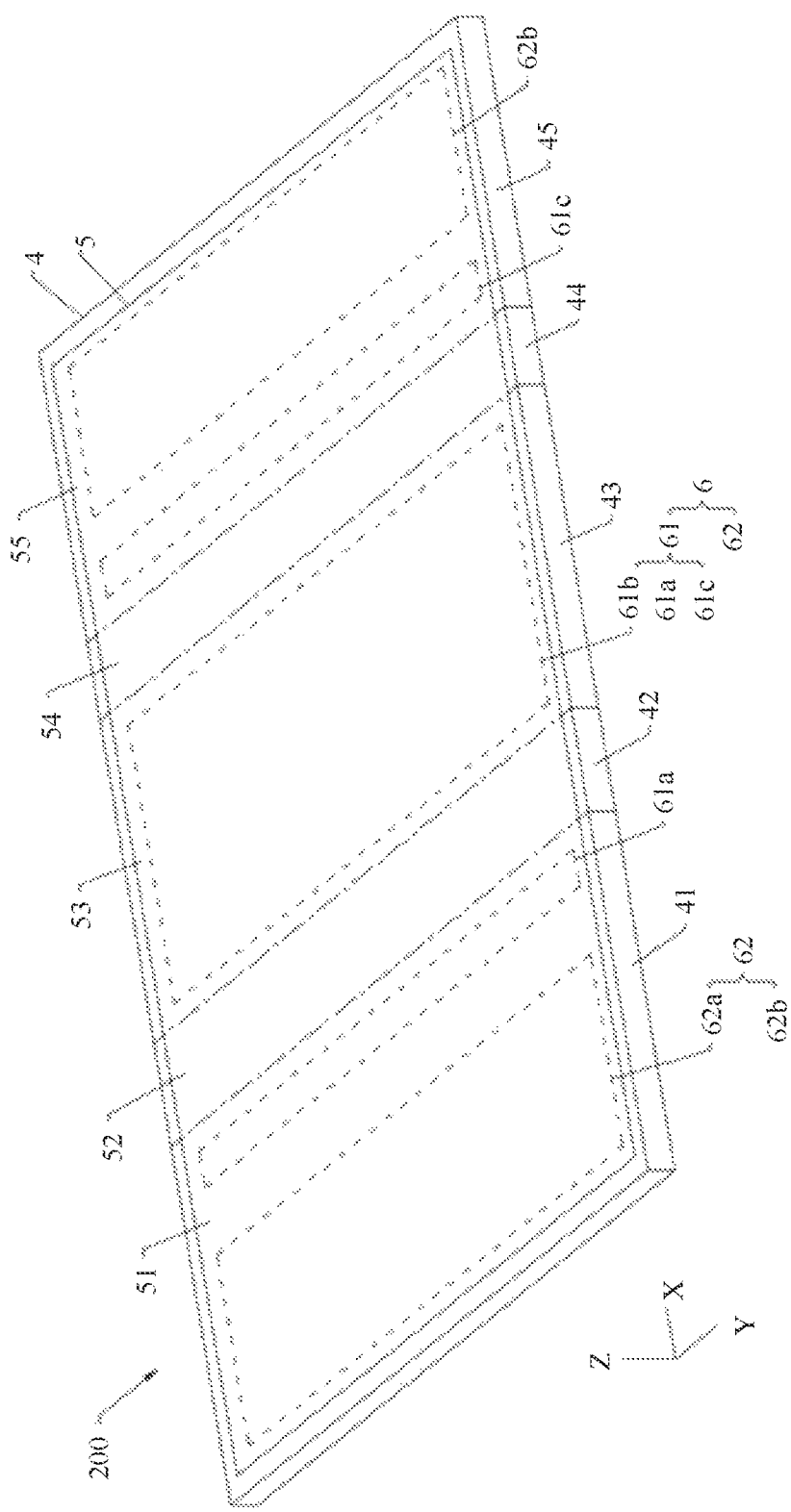
FIG. 12 is a schematic diagram of an internal structure of still another electronic device in an opened state according to an embodiment of this application.
Figure 13:
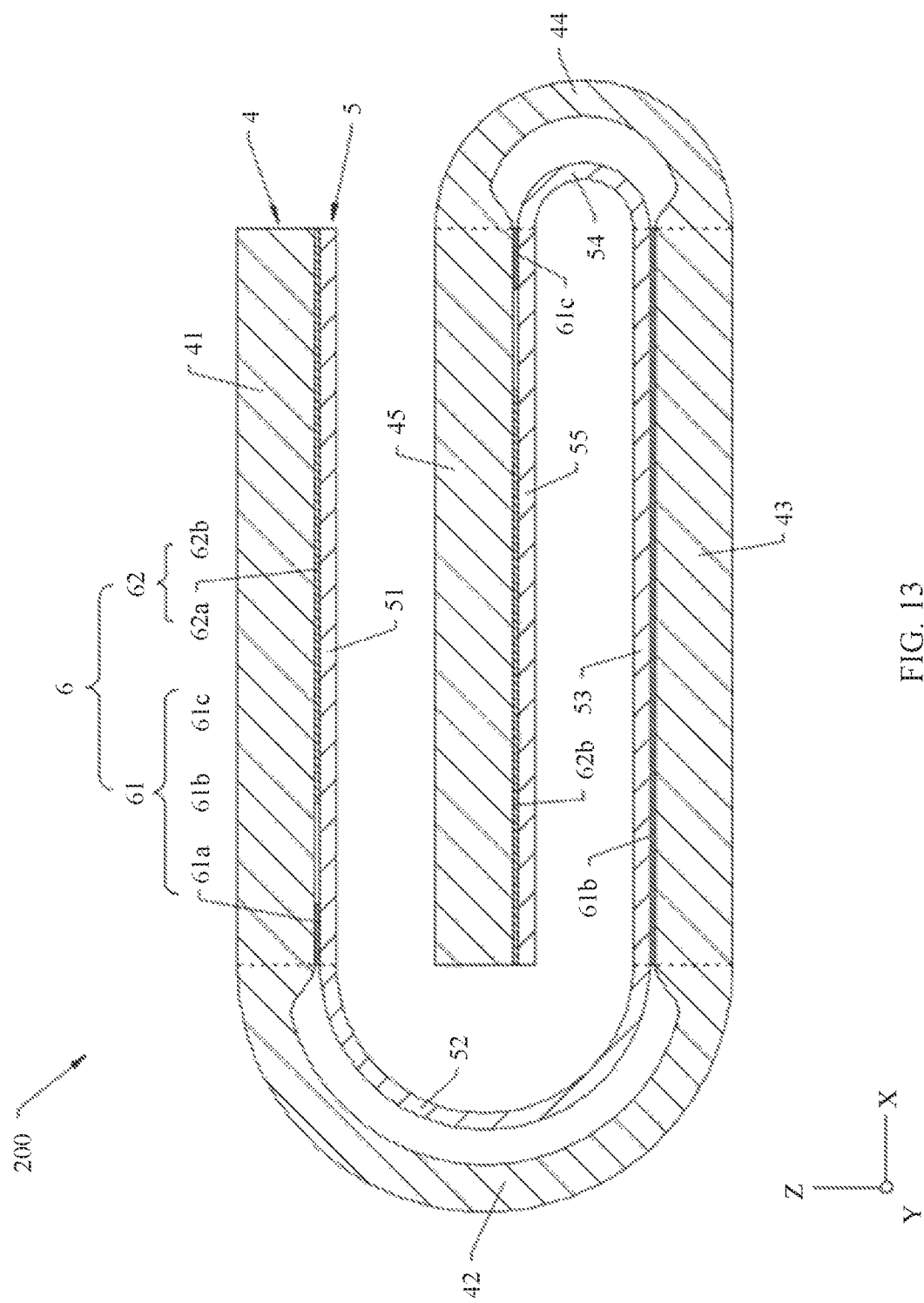
FIG. 13 is a schematic diagram of an internal structure of the electronic device shown in FIG. 12 in a closed state.

Refer to FIG. 12 and FIG. 13 together. FIG. 12 is a schematic diagram of an internal structure of still another electronic device 200 in an opened state according to an embodiment of this application, and FIG. 13 is a schematic diagram of an internal structure of the electronic device 200 shown in FIG. 12 in a closed state. The electronic device 200 in this embodiment includes most features of the electronic device 100 in the foregoing embodiments. The following mainly describes differences between the electronic device 200 and the electronic device 100 in the foregoing embodiments, and most same content is not described again.

The electronic device 200 includes a housing assembly 4, a flexible display 5, and an adhesive layer assembly 6. The adhesive layer assembly 6 is bonded between the housing assembly 4 and the flexible display 5.

The housing assembly 4 includes a first housing 41, a first rotating shaft 42, a second housing 43, a second rotating shaft 44, and a third housing 45 that are connected in sequence. The first rotating shaft 42 can deform, so that the first housing 41 and the second housing 43 are unfolded or folded relative to each other, and the second rotating shaft 44 can deform, so that the second housing 43 and the third housing 45 are unfolded or folded relative to each other. For example, when the first housing 41, the second housing 43, and the third housing 45 are relatively unfolded to an opened state, the electronic device 200 is approximately flat. When the first housing 41, the second housing 43, and the third housing 45 are relatively folded to a closed state (that is, the electronic device 200 is in a closed state), the third housing 45 is located between the first housing 41 and the second housing 43. When one of the first housing 41 and the third housing 45 is opened relative to the second housing 43, and the other is closed relative to the second housing 43, the electronic device 200 is in a partially opened state.

The flexible display 5 includes a first non-bending part 51, a first bending part 52, a second non-bending part 53, a second bending part 54, and a third non-bending part 55 that are sequentially arranged. The first non-bending part 51 faces the first housing 41, the first bending part 52 faces the first rotating shaft 42, the second non-bending part 53 faces the second housing 43, the second bending part 54 faces the second rotating shaft 44, and the third non-bending part 55 faces the third housing 45. The flexible display 5 may be of a continuous and integrated display structure. The first non-bending part 51, the first bending part 52, the second non-bending part 53, the second bending part 54, and the third non-bending part 55 are all parts of the flexible display 2.

The adhesive layer assembly 6 includes three strong adhesive layers 61 and two weak adhesive layers 62, a stiffness of the strong adhesive layer 61 is higher than a stiffness of the weak adhesive layer 62, the two weak adhesive layers 62 are respectively fastened between the first housing 41 and the first bending part 52 and between the third housing 45 and the third non-bending part 55, and the three strong adhesive layers 61 are located between the two weak adhesive layers 62. The three strong adhesive layers 61 are respectively fastened between the first housing 41 and the first bending part 52, between the second housing 43 and the second non-bending part 53, and between the third housing 45 and the third non-bending part 55.

For example, the adhesive layer assembly 6 includes a first strong adhesive layer 61a, a second strong adhesive layer 61b, a third strong adhesive layer 61c, a first weak adhesive layer 62a, and a second weak adhesive layer 62b. Both the first strong adhesive layer 61a and the first weak adhesive layer 62a are fastened between the first housing 41 and the first bending part 52, and the first strong adhesive layer 61a is close to the first bending part 52 relative to the first weak adhesive layer 62a. The second strong adhesive layer 61b is fastened between the second housing 43 and the second non-bending part 53, both the third strong adhesive layer 61c and the second weak adhesive layer 62b are fastened between the third housing 45 and the third non-bending part 55, and the third strong adhesive layer 61c is close to the second bending part 54 relative to the second weak adhesive layer 62b. A stiffness of the first strong adhesive layer 61a, the second strong adhesive layer 61b, and the third strong adhesive layer 61c is higher than a stiffness of the first weak adhesive layer 62a and the second weak adhesive layer 62b.

In this embodiment, the flexible display 5 can be unfolded or folded with the housing assembly 4. When the electronic device 200 is in an opened state, the flexible display 5 is unfolded and flattened, and can perform display in full screen, so that the electronic device 200 has a relatively large display area, to improve viewing experience of a user. When the electronic device 200 is in a closed state, the flexible display 5 is folded inside the housing assembly 4, and a planar size of the electronic device 200 is relatively small, helping the user carry and store the electronic device.

In a process in which the first housing 41, the second housing 43, and the third housing 45 are folded relative to each other to drive the flexible display 5 to be folded, the flexible display 5 moves to be dislocated relative to the housing assembly 4 due to stress generated by deformation of the bent flexible display 5. In this case, the first non-bending part 51 is bonded to the first housing 41 by using the strong adhesive layer 61 and the weak adhesive layer 62, and the strong adhesive layer 61 is disposed close to the first rotating shaft 42. The second non-bending part 53 is bonded to the second housing 43 by using the strong adhesive layer 61, the third non-bending part 55 is bonded to the third housing 45 by using the strong adhesive layer 61 and the weak adhesive layer 62, and the strong adhesive layer 61 is disposed close to the second rotating shaft 44. In addition, a stiffness of the strong adhesive layer 61 is higher than a stiffness of the weak adhesive layer 62. Therefore, when the flexible display 5 is folded, a dislocation of the second non-bending part 53 of the flexible display 5 relative to the second housing 43 is relatively small, a dislocation of the first bending part 52 relative to the first housing 41 is relatively small, and a dislocation of the second bending part 54 relative to the third housing 45 is also relatively small, thereby reducing a risk of arching, film layer separation, or an adhesive failure of the flexible display 5 in a process of unfolding the electronic device 200 because the flexible display 5 cannot be fully restored, and improving reliability of the flexible display 5. In addition, the first non-bending part 51 can follow the first bending part 52 to be dislocated relative to the first housing 41, the third non-bending part 55 can also follow the second bending part 54 to be dislocated relative to the third housing 45, and stress between the flexible display 5 and the housing assembly 4 is reduced, thereby reducing a risk of arching, film layer separation or an adhesive failure of the flexible display 5 because a force locally applied to the flexible display is excessively large, and improving the reliability of the flexible display 5. Therefore, the electronic device 200 is provided with the adhesive layer assembly 6, to improve the reliability of the flexible display 5, so that a service life of the electronic device 200 is relatively long, and user experience is better.

It may be understood that when the flexible display 5 is folded or unfolded with the housing assembly 4, the flexible display 5 moves slightly in a staggered manner relative to the housing assembly 4, and a movement direction of the flexible display 5 is related to specific designs (for example, parameters such as a structure, a size, and a location) of the flexible display 5, the adhesive layer assembly 6, and the housing assembly 4. For example, when the flexible display 5 is folded with the housing assembly 4, the second non-bending part 53 of the flexible display 5 does not move relative to the second housing 43, the first non-bending part 51 moves in a direction away from the first rotating shaft 42 relative to the first housing 41, and the third non-bending part 55 moves in a direction away from the second rotating shaft 44 relative to the third housing 45.

In some embodiments, the strong adhesive layer 61 (namely, the second strong adhesive layer 61b) located between the second non-bending part 53 and the second housing 43 may be of a continuous whole-plane structure. In some other embodiments, the strong adhesive layer 61 (namely, the second strong adhesive layer 61b) located between the second non-bending part 53 and the second housing 43 may alternatively of a discontinuous structure. For example, the second strong adhesive layer 61b includes at least two adhesive strips. One adhesive strip is fastened to a side that is of the second non-bending part 53 and that is close to the first bending part 52, and the other adhesive strip is fastened to a side that is of the second non-bending part 53 and that is close to the second bending part 54. It may be understood that, for other designs of the strong adhesive layer 61 and the weak adhesive layer 62 in the electronic device 200, refer to related descriptions in the foregoing embodiments.

In this embodiment of this application, when the electronic device 200 is in a closed state, the bent flexible display 5 is slightly dislocated relative to the housing assembly 4, and a plurality of layer structures of the flexible display 5 are also slightly dislocated relative to each other.

Figure 14:
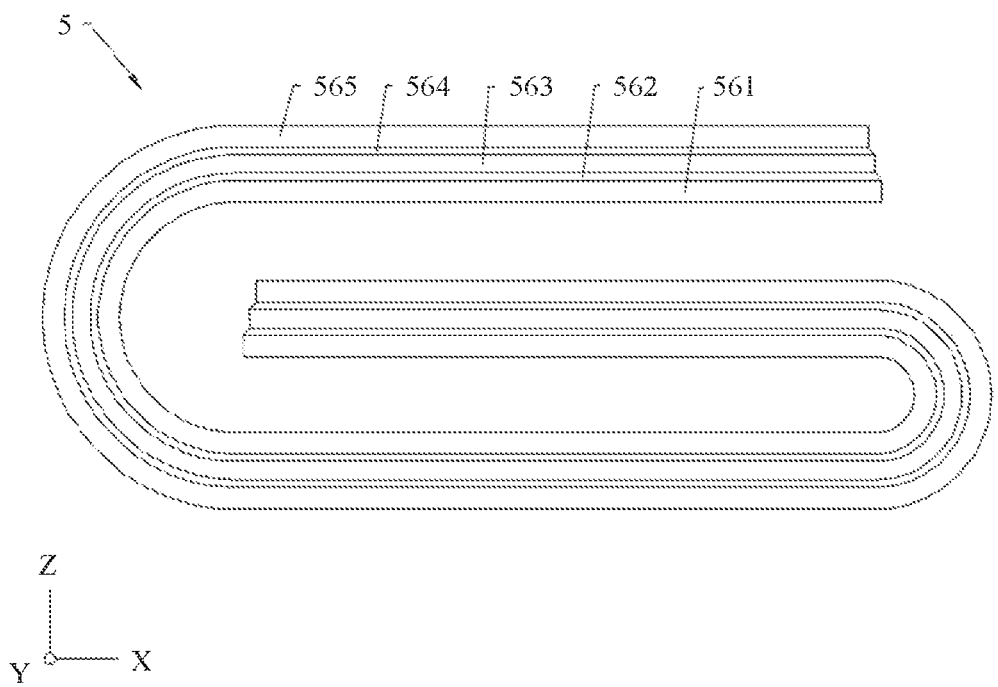
FIG. 14 is a schematic diagram of a structure of a flexible display of the electronic device shown in FIG. 13.

Refer to FIG. 14. FIG. 14 is a schematic diagram of a structure of the flexible display 5 of the electronic device 200 shown in FIG. 13.

In some embodiments, the flexible display 5 includes a plurality of film layers that are disposed in a stacked manner, and adhesive layers, and each adhesive layer is located between any adjacent film layers located on two sides and is configured to implement bonding and fastening. For example, in the embodiment of FIG. 14, the plurality of film layers and the plurality of adhesive layers are simplified into a first film layer 561, a first adhesive layer 562, a second film layer 563, a second adhesive layer 564, and a third film layer 565 that are sequentially disposed in a stacked manner. The third film layer 565 is configured to be fastened to the adhesive layer assembly 6.

When the flexible display 5 is bent, due to different bending radiuses, layer structures of the flexible display 5 may move to be dislocated relative to each other, to maintain constant lengths of the layer structures. Dislocation deformation between materials of the plurality of layers is mainly absorbed by a low-modulus material of a layer (for example, an adhesive layer), to reduce a risk of film layer separation or an adhesive failure caused by the fact that the flexible display 5 cannot meet a corresponding dislocation movement requirement or stress strain.

In the embodiment of FIG. 14, for example, at an end part of the flexible display 5, the first film layer 561 protrudes relative to the second film layer 563, the second film layer 563 protrudes relative to the third film layer 565, and the first adhesive layer 562 and the second adhesive layer 564 deform. In other words, a layer structure inside the flexible display 5 is dislocated in a direction of approaching the end part of the flexible display 5, relative to a layer structure outside the flexible display. A modulus of the first adhesive layer 562 and a modulus of the second adhesive layer 564 are less than a modulus of the first film layer 561, a modulus of the second film layer 563, and a modulus of the third film layer 565. In other words, a stiffness of these adhesive layers is less than a stiffness of the film layers. Deformation of these adhesive layers enables smooth dislocation between the plurality of film layers, thereby reducing a risk of film layer separation or an adhesive failure of the flexible display 5, and improving reliability of the flexible display 5.

In some embodiments, the flexible display 5 includes a display panel and a support that are disposed in a stacked manner. The support is located on a non-display side of the display panel, and is fastened to the adhesive layer assembly 6. For a specific structure, refer to the foregoing embodiments.

It may be understood that, for a related design of another structure of the electronic device 200 in this embodiment, refer to the foregoing embodiments.

Figure 15:
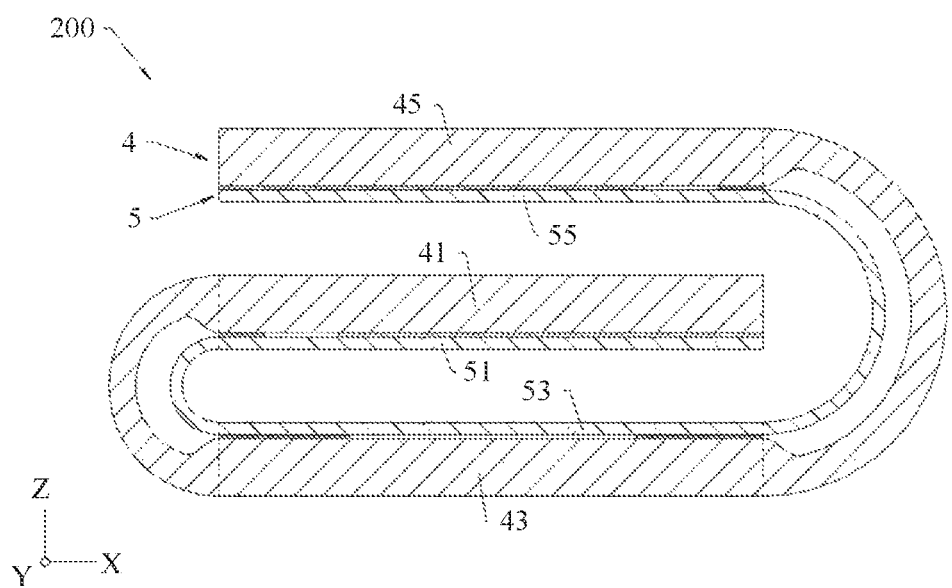
FIG. 15 is a schematic diagram of an internal structure of yet another electronic device in a closed state according to an embodiment of this application.

Refer to FIG. 15 together. FIG. 15 is a schematic diagram of an internal structure of yet another electronic device 200 in a closed state according to an embodiment of this application. The electronic device 200 in this embodiment includes most features of the electronic device (100/200) in the foregoing embodiments. The following mainly describes differences between the electronic device 200 in this embodiment and the electronic device (100/200) in the foregoing embodiments, and most same content is not described again.

When a first housing 41, a second housing 43, and a third housing 45 of a housing assembly 4 are folded relative to each other to a closed state, the first housing 41 is located between the second housing 43 and the third housing 45, and a first non-bending part 51 of a flexible display 5 is located between a second non-bending part 53 and a third non-bending part 55. In this case, the electronic device 200 is approximately in a rolled structure.

It may be understood that, for a related design of another structure of the electronic device 200 in this embodiment, refer to the foregoing embodiments.

Figure 16:
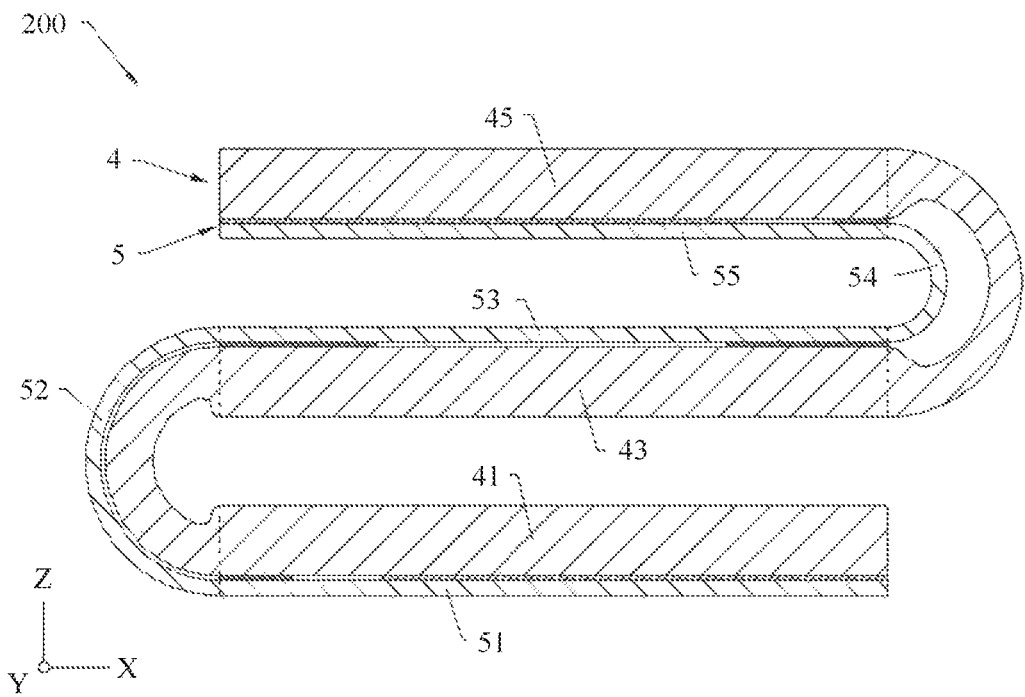
FIG. 16 is a schematic diagram of an internal structure of still yet another electronic device in a closed state according to an embodiment of this application.

Refer to FIG. 16 together. FIG. 16 is a schematic diagram of an internal structure of still yet another electronic device 200 in a closed state according to an embodiment of this application. The electronic device 200 in this embodiment includes most features of the electronic device (100/200) in the foregoing embodiments. The following mainly describes differences between the electronic device 200 in this embodiment and the electronic device (100/200) in the foregoing embodiments, and most same content is not described again.

When a first housing 41, a second housing 43, and a third housing 45 of a housing assembly 4 are folded relative to each other to a closed state, the second housing 43 is located between the first housing 41 and the third housing 45, and a second non-bending part 53 of a flexible display 5 is located between a first non-bending part 51 and a second non-bending part 55. In this case, the electronic device 200 is approximately S-shaped, and when the electronic device 200 is in a closed state, the flexible display 5 is partially folded inwards and partially exposed. For example, the first non-bending part 51 and a first bending part 52 of the flexible display 5 are exposed, and the second non-bending part 53, a second bending part 54, and the third non-bending part 55 are folded inwards. In some other embodiments, by designing a bending direction of the housing assembly 4, the third non-bending part 55 and the second bending part 54 of the flexible display 5 may be exposed, and the second non-bending part 53, the first bending part 52, and the first non-bending part 51 may be folded inwards.

Figure 17:
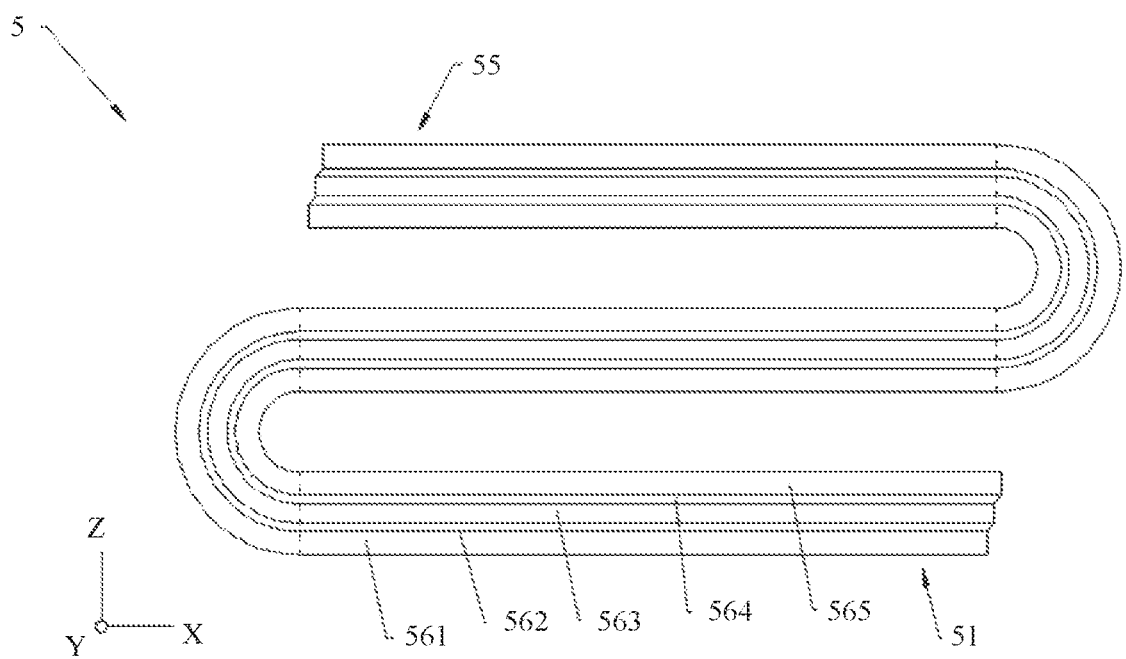
FIG. 17 is a schematic diagram of a structure of a flexible display of the electronic device shown in FIG. 16.

Refer to FIG. 17. FIG. 17 is a schematic diagram of a structure of the flexible display 5 of the electronic device 200 shown in FIG. 16.

The flexible display 5 includes a plurality of film layers disposed in a stacked manner, and adhesive layers, and each adhesive layer is located between any adjacent film layers located on two sides and is configured to implement bonding and fastening. For example, in the embodiment of FIG. 17, the plurality of film layers and the plurality of adhesive layers are simplified into a first film layer 561, a first adhesive layer 562, a second film layer 563, a second adhesive layer 564, and a third film layer 565 that are sequentially disposed in a stacked manner. The third film layer 565 is configured to be fastened to the adhesive layer assembly 6.

When the flexible display 5 is bent, due to different bending radiuses, layer structures of the flexible display 5 may move to be dislocated relative to each other, to maintain constant lengths of the layer structures. Dislocation deformation between materials of the plurality of layers is mainly absorbed by a low-modulus material of a layer (for example, an adhesive layer), to reduce a risk of film layer separation or an adhesive failure caused by the fact that the flexible display 5 cannot meet a corresponding dislocation movement requirement or stress strain.

In an embodiment of FIG. 17, for example, at an end part of the first non-bending part 51 of the flexible display 5, the third film layer 565 protrudes relative to the second film layer 563, and the second film layer 563 protrudes relative to the first film layer 561. At an end part of the third non-bending part 55 of the flexible display 5, the first film layer 561 protrudes relative to the second film layer 563, the second film layer 563 protrudes relative to the third film layer 565, and the first adhesive layer 562 and the second adhesive layer 564 deform. In other words, a modulus of the first adhesive layer 562 and a modulus of the second adhesive layer 564 are less than a modulus of the first film layer 561, a modulus of the second film layer 563, and a modulus of the third film layer 565. In other words, a stiffness of these adhesive layers is less than a stiffness of the film layers. Deformation of these adhesive layers enables smooth dislocation between the plurality of film layers, thereby reducing a risk of film layer separation or an adhesive failure of the flexible display 5, and improving reliability of the flexible display 5.

In this embodiment, because the flexible display 5 is in an S shape when the electronic device 200 is in a closed state, a bending radius difference between layer structures of the flexible display 5 is relatively small, and dislocation statuses of the plurality of film layers of the flexible display 5 at two ends are opposite, so that a dislocation requirement between the plurality of layer structures of the flexible display 5 can be reduced, and reliability of the flexible display 5 is improved.

It may be understood that, for a related design of another structure of the electronic device 200 in this embodiment, refer to the foregoing embodiments.

The foregoing descriptions are merely specific implementations of the present invention, but are not intended to limit the protection scope of the present invention. Any variation or replacement readily figured out by a person skilled in the art within the technical scope disclosed in this application shall fall within the protection scope of the present invention. When no conflict occurs, embodiments of the present invention and features in the embodiments may be mutually combined. Therefore, the protection scope of the present invention shall be subject to the protection scope of the claims.

What is claimed is:

1. An electronic device comprising:
   a housing assembly comprising:
      a first housing;
      a rotating shaft; and
      a second housing,
      wherein the first housing, the rotating shaft, and the second housing are coupled in sequence, and
      wherein the rotating shaft is configured to deform to enable the first housing and the second housing to unfold or fold relative to each other;
   a flexible display comprising:
      a first non-bending part facing the first housing;
      a bending part facing the rotating shaft; and
      a second non-bending part facing the second housing,
      wherein the first non-bending part, the bending part, and the second non-bending part are arranged in sequence, and
      wherein the flexible display is located inside the housing assembly when the first housing and the second housing are folded relative to each other to a closed state; and
   an adhesive layer assembly bonded between the housing assembly and the flexible display and comprising:
      two strong adhesive layers comprising:
         a first strong adhesive layer; and
         a second strong adhesive layer; and
      two weak adhesive layers comprising:
         a first weak adhesive layer; and
         a second weak adhesive layer,
      wherein the first strong adhesive layer and the first weak adhesive layer are bonded between the first non-bending part and the first housing,
      wherein the second strong adhesive layer and the second weak adhesive layer are bonded between the second non-bending part and the second housing,
      wherein a corresponding strong adhesive layer is proximate to the rotating shaft relative to an adjacent weak adhesive layer, and
      wherein a first stiffness of each of the two strong adhesive layers is higher than a second stiffness of each of the two weak adhesive layers.

2. The electronic device of claim 1, wherein a first modulus of each of the two strong adhesive layers is greater than a second modulus of each of the two weak adhesive layers.

3. The electronic device of claim 2, wherein each of the two strong adhesive layers is made of a first double-sided adhesive material with a first carrier comprising polyethylene terephthalate, and wherein each of the two weak adhesive layers is made of a second double-sided adhesive material with a second carrier comprising foam.

4. The electronic device of claim 1, wherein each of the two weak adhesive layers comprises one or more hollow regions to form a patterned structure.

5. The electronic device of claim 4, wherein each of the two weak adhesive layers is of a frame structure.

6. The electronic device of claim 1, wherein the flexible display further comprises:
   a display panel; and
   a support disposed with the display panel in a stacked manner and bonded to the adhesive layer assembly, wherein the support comprises:
      a first metal plate part located in the first non-bending part;
      a third metal plate part located in the second non-bending part; and
      a second metal plate part located in the bending part and configured to bend, wherein a second thickness of the second metal plate part is less than a first thickness of the first metal plate part and less than a third thickness of the third metal plate part.

7. An electronic device comprising:
   a housing assembly comprising:
      a first housing;
      a first rotating shaft;
      a second housing;
      a second rotating shaft; and
      a third housing,
      wherein the first housing, the first rotating shaft, the second housing, the second rotating shaft, and the third housing are coupled in sequence,
      wherein the first rotating shaft is configured to deform to enable the first housing and the second housing to unfold or fold relative to each other, and
      wherein the second rotating shaft is configured to deform to enable the second housing and the third housing to unfold or fold relative to each other;
   a flexible display comprising:
      a first non-bending part facing the first housing;
      a first bending part facing the first rotating shaft;
      a second non-bending part facing the second housing;
      a second bending part facing the second rotating shaft; and
      a third non-bending part facing the third housing,
      wherein the first non-bending part, the first bending part, the second non-bending part, the second bending part, and the third non-bending part are arranged in sequence; and
   an adhesive layer assembly bonded between the housing assembly and the flexible display and comprising:
      two weak adhesive layers comprising:
         a first weak adhesive layer fastened between the first housing and the first bending part; and
         a second weak adhesive layer fastened between the third housing and the third non-bending part; and
      three strong adhesive layers located between the two weak adhesive layers and comprising:
         a first strong adhesive layer fastened between the first housing and the first bending part;
         a second strong adhesive layer fastened between the second housing and the second non-bending part; and
         a third strong adhesive layer fastened between the third housing and the third non-bending part, wherein a first stiffness of each of the three strong adhesive layers is higher than a second stiffness of each of the two weak adhesive layers.

8. The electronic device of claim 7, wherein a first modulus of each of the three strong adhesive layers is greater than a second modulus of each of the two weak adhesive layers.

9. The electronic device of claim 8, wherein each of the three strong adhesive layers is made of either a first double-sided adhesive material with a first carrier comprising polyethylene terephthalate or a hot-melt adhesive material, and wherein each of the two weak adhesive layers is made of either a second double-sided adhesive material with a second carrier comprising foam or a silica gel material.

10. The electronic device of claim 7, wherein each of the two weak adhesive layers comprises one or more hollow regions to form a patterned structure.

11. The electronic device of claim 10, wherein each of the two weak adhesive layers is of a frame structure, is of a grid structure, comprises a plurality of long adhesive strips distributed at first intervals, comprises a plurality of third adhesive blocks distributed at second intervals, or comprises a plurality of first adhesive blocks and a plurality of second adhesive blocks, wherein a second area of each of the second adhesive blocks is different from a first area of each of the first adhesive blocks, and wherein the first adhesive blocks and the second adhesive blocks are distributed at third intervals.

12. The electronic device of claim 7, wherein the first housing, the second housing, and the third housing are folded relative to each other to a closed state, and wherein the first housing is located between the second housing and the third housing, the third housing is located between the first housing and the second housing, or the second housing is located between the first housing and the third housing.

13. The electronic device of claim 2, wherein each of the two strong adhesive layers is made of a double-sided adhesive material with a carrier comprising polyethylene terephthalate, and wherein each of the two weak adhesive layers is made of a silica gel material.

14. The electronic device of claim 2, wherein each of the two strong adhesive layers is made of a hot-melt adhesive material, and wherein each of the two weak adhesive layers is made of a double-sided adhesive material with a carrier comprising foam.

15. The electronic device of claim 2, wherein each of the two strong adhesive layers is made of a hot-melt adhesive material, and wherein each of the two weak adhesive layers is made of a silica gel material.

16. The electronic device of claim 4, wherein each of the two weak adhesive layers is of a grid structure.

17. The electronic device of claim 4, wherein each of the two weak adhesive layers comprises a plurality of long adhesive strips distributed at intervals.

18. The electronic device of claim 4, wherein each of the two weak adhesive layers comprises a plurality of adhesive blocks distributed at intervals.

19. The electronic device of claim 4, wherein each of the two weak adhesive layers comprises a plurality of first adhesive blocks and a plurality of second adhesive blocks, wherein a first area of each of the second adhesive blocks is different from a second area of each of the first adhesive blocks, and wherein the first adhesive blocks and the second adhesive blocks are distributed at intervals.

20. The electronic device of claim 1, wherein the flexible display further comprises:
a display panel; and
a support disposed with the display panel in a stacked manner and bonded to the adhesive layer assembly, wherein the support comprises:
a first metal plate part located in the first non-bending part;
a second metal plate part located in the bending part and configured to bend,
wherein one or more hollow holes are disposed in the second metal plate part; and
a third metal plate part located in the second non-bending part.

* * * * *